(12) United States Patent
Ito et al.

(10) Patent No.: US 12,267,958 B2
(45) Date of Patent: Apr. 1, 2025

(54) ELECTRONIC COMPONENT AND MANUFACTURING METHOD THEREOF

(71) Applicant: Murata Manufacturing Co., Ltd., Kyoto-fu (JP)

(72) Inventors: Hiromitsu Ito, Nagaokakyo (JP); Yuichi Iida, Nagaokakyo (JP); Isamu Utsunomiya, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 159 days.

(21) Appl. No.: 18/348,813

(22) Filed: Jul. 7, 2023

(65) Prior Publication Data
US 2024/0040699 A1  Feb. 1, 2024

(30) Foreign Application Priority Data

Jul. 29, 2022 (JP) .................................. 2022-121916

(51) Int. Cl.
| | |
|---|---|
| H05K 1/16 | (2006.01) |
| H05K 1/03 | (2006.01) |
| H05K 1/11 | (2006.01) |
| H05K 3/00 | (2006.01) |
| H05K 3/28 | (2006.01) |
| H05K 3/40 | (2006.01) |

(52) U.S. Cl.
CPC .......... *H05K 1/115* (2013.01); *H05K 1/0306* (2013.01); *H05K 3/002* (2013.01); *H05K 3/28* (2013.01); *H05K 3/4007* (2013.01); *H05K 3/4038* (2013.01); *H05K 2201/09581* (2013.01); *H05K 2201/099* (2013.01); *H05K 2203/0228* (2013.01); *H05K 2203/107* (2013.01)

(58) Field of Classification Search
CPC .................. H01F 27/292; H01F 27/34; H05K 2201/09145; H05K 2203/0228; H05K 1/165

See application file for complete search history.

(56) References Cited

U.S. PATENT DOCUMENTS

2002/0153165 A1* 10/2002 Kojima ................ B23K 26/351
174/256
2021/0230048 A1* 7/2021 Yagi .................... C03C 10/0045

FOREIGN PATENT DOCUMENTS

| JP | 2010-153745 A | 7/2010 |
| JP | 2013-098350 A | 5/2013 |

* cited by examiner

*Primary Examiner* — Sherman Ng
(74) *Attorney, Agent, or Firm* — Studebaker Brackett PLLC

(57) ABSTRACT

An electronic component includes a glass substrate having a glass body and a protruding crystallized portion, the glass body including a top surface, a bottom surface, and a first side surface connecting the bottom surface and the top surface to each other, and the first side surface having the crystallized portion; a colored insulation layer on the first side surface; and a through-conductor within the glass body and extending through the top surface and the bottom surface. The crystallized portion extends in a first direction that is parallel to the bottom surface, as viewed from a direction orthogonal to the first side surface. As viewed from the direction orthogonal to the first side surface, at least a portion of the colored insulation layer extends in the first direction and is disposed adjacent to the crystallized portion in a second direction that is orthogonal to the first direction.

20 Claims, 16 Drawing Sheets

ELECTRONIC COMPONENT AND MANUFACTURING METHOD THEREOF

CROSS-REFERENCE TO RELATED APPLICATION

This application claims benefit of priority to Japanese Patent Application No. 2022-121916, filed Jul. 29, 2022, the entire content of which is incorporated herein by reference.

BACKGROUND

Technical Field

The present disclosure relates to electronic components and manufacturing methods thereof.

Background Art

An electronic component in the related art is described in Japanese Unexamined Patent Application Publication No. 2013-98350. This electronic component includes a glass body and a conductor provided inside the glass body.

SUMMARY

Glass is advantageous for being insulative and for being physically and chemically stable, and is thus widely used as insulators and structures of electronic components. In particular, the electronic component in the related art that has the conductor incorporated inside the glass body is suitable for use as a compact high-frequency-signal inductor component that requires a non-magnetic structure.

On the other hand, highly-transparent glass used as the glass may be problematic due to being transparent. For example, a mounter in recent years often has a function for detecting, for example, the presence or absence of an electronic component or the thickness of the electronic component by detecting a side surface of the electronic component by using a laser sensor or a camera. A transparent electronic component using glass is problematic in being difficult to be recognized by the laser sensor or the camera of the mounter. There is also a problem in terms of a difficulty in, for example, appearance inspection using a camera.

Accordingly, the present disclosure provides an electronic component and a manufacturing method thereof that facilitate detection by a detector, such as a laser sensor or a camera.

An electronic component according to an aspect of the present disclosure includes a glass substrate, a colored insulation layer, and a through-conductor. The glass substrate has a glass body and a protruding crystallized portion. The glass body includes a top surface, a bottom surface, and a first side surface connecting the bottom surface and the top surface to each other. The first side surface of the glass body is provided with the crystallized portion. The colored insulation layer is provided on the first side surface of the glass body. The through-conductor is provided within the glass body and extends through the top surface and the bottom surface. The crystallized portion extends in a first direction that is orthogonal to the bottom surface, as viewed from a direction orthogonal to the first side surface. As viewed from the direction orthogonal to the first side surface, at least a portion of the colored insulation layer extends in the first direction and is disposed adjacent to the crystallized portion in a second direction that is orthogonal to the first direction.

As viewed from the direction orthogonal to the first side surface, the extending direction of the crystallized portion may be not only aligned completely with the first direction but also aligned substantially with the first direction. For example, an inclination angle formed between the extending direction of the crystallized portion and the first direction may be 10° or smaller. The same applies to the extending direction of the colored insulation layer.

According to the above aspect, the first side surface of the glass body is provided with the crystallized portion and the colored insulation layer, so that when the electronic component is to be detected from the first side surface of the glass body by using a detector, such as a laser sensor or a camera, the crystallized portion and the colored insulation layer with low transparency can be readily recognized, whereby the electronic component can be readily detected.

Furthermore, as viewed from the direction orthogonal to the first side surface, the crystallized portion and the colored insulation layer extend in the first direction, so that when the electronic component is to be detected by scanning the detector in the first direction, the crystallized portion or the colored insulation layer can be readily recognized, whereby the electronic component can be readily detected.

Moreover, since the first side surface of the glass body is provided with the crystallized portion and the colored insulation layer, the exposed area of the glass body can be reduced, and the mechanical strength of the electronic component against an external force can be increased.

Preferably, in the electronic component according to an embodiment, an area where the first side surface does not have the crystallized portion is entirely provided with the colored insulation layer.

According to the above embodiment, the entire area of the first side surface can be covered with the crystallized portion and the colored insulation layer. Accordingly, the electronic component can be detected more readily by the detector, and the mechanical strength of the electronic component can be further increased.

Preferably, in the electronic component according to an embodiment, a thickness of the crystallized portion in the direction orthogonal to the first side surface and a thickness of the colored insulation layer in the direction orthogonal to the first side surface are equal to each other.

The term "thickness" refers to an average thickness, and is specifically an average value when a plurality of points are measured in a cross section including the direction orthogonal to the first side surface and the second direction.

According to the above embodiment, the crystallized portion and the colored insulation layer can be made flush with each other in the direction orthogonal to the first side surface. Accordingly, a step between the crystallized portion and the colored insulation layer in the direction orthogonal to the first side surface can be eliminated, and the possibility of delamination of the colored insulation layer as well as chipping and cracking of the crystallized portion as a result of coming into contact with an object can be reduced.

Preferably, in the electronic component according to an embodiment, a height of the crystallized portion in the second direction is smaller than a height of the colored insulation layer in the second direction.

The term "height" refers to a maximum height, and is specifically an average value when measured in a cross section including the direction orthogonal to the first side surface and the second direction.

According to the above embodiment, the crystallized portion can be made smaller, so that the possibility of an object coming into contact with the crystallized portion can be reduced, thereby reducing the possibility of chipping and cracking of the crystallized portion. Moreover, the possibility of an occurrence of stray capacitance can be reduced at the crystallized portion. Furthermore, since the colored insulation layer can be made larger, the mechanical strength of the electronic component can be increased.

Preferably, in the electronic component according to an embodiment, a relationship between a height h1 of the crystallized portion in the second direction and a height H of the first side surface in the second direction satisfies $1/5 < h1/H < 1/2$.

According to the above embodiment, because $h1/H < 1/2$ is satisfied, the crystallized portion is prevented from being larger than necessary, so that the possibility of an object coming into contact with the crystallized portion can be reduced, whereby the possibility of chipping and cracking of the crystallized portion can be reduced. Moreover, the possibility of an occurrence of stray capacitance can be reduced at the crystallized portion. On the other hand, because $1/5 < h1/H$ is satisfied, the crystallized portion is prevented from being smaller than necessary, so that the mechanical strength of the crystallized portion can be ensured.

Preferably, the electronic component according to an embodiment further includes a terminal electrode disposed above the bottom surface and electrically connected to the through-conductor. The crystallized portion is disposed toward the bottom surface relative to the colored insulation layer.

According to the above embodiment, the crystallized portion can be disposed away from the top surface, so that when an outer-surface conductor is disposed above the top surface, the possibility of an occurrence of stray capacitance can be reduced near the outer-surface conductor.

After the terminal electrode of the electronic component is mounted to a mount substrate such that the bottom surface of the glass body faces the mount substrate, an object may tend to come into contact with the electronic component at the top surface of the glass body. However, because the crystallized portion is disposed toward the bottom surface, contact of the object with the crystallized portion can be reduced, thereby reducing the possibility of chipping and cracking of the crystallized portion.

Preferably, the electronic component according to an embodiment further includes a terminal electrode disposed above the bottom surface and electrically connected to the through-conductor. The crystallized portion is disposed toward the top surface relative to the colored insulation layer.

According to the above embodiment, the crystallized portion can be disposed away from the terminal electrode, so that the possibility of an occurrence of stray capacitance can be reduced near the terminal electrode.

When the top surface of the glass body is to be retained by using a mounter and the terminal electrode of the electronic component is to be mounted to a mount substrate such that the bottom surface of the glass body faces the mount substrate, an object may tend to come into contact with the electronic component at the bottom surface of the glass body. However, because the crystallized portion is disposed toward the top surface, contact of the object with the crystallized portion can be reduced, thereby reducing the possibility of chipping and cracking of the crystallized portion.

Preferably, the electronic component according to an embodiment further includes a terminal electrode disposed above the bottom surface and electrically connected to the through-conductor. The colored insulation layer includes a first region disposed toward the top surface relative to the crystallized portion and a second region disposed toward the bottom surface relative to the crystallized portion.

According to the above embodiment, the crystallized portion can be disposed away from the top surface and the bottom surface, so that the crystallized portion can be disposed away from the corners of the glass substrate where stress tends to concentrate, thereby reducing the possibility of chipping and cracking of the crystallized portion.

Furthermore, the crystallized portion can be disposed away from the top surface, so that when the outer-surface conductor is disposed above the top surface, the possibility of an occurrence of stray capacitance can be reduced near the outer-surface conductor.

After the terminal electrode of the electronic component is mounted to a mount substrate such that the bottom surface of the glass body faces the mount substrate, an object may tend to come into contact with the electronic component at the top surface of the glass body. However, because the crystallized portion can be disposed away from the top surface, contact of the object with the crystallized portion can be reduced, thereby reducing the possibility of chipping and cracking of the crystallized portion.

Furthermore, because the crystallized portion can be disposed away from the terminal electrode, the possibility of an occurrence of stray capacitance can be reduced near the terminal electrode.

When the top surface of the glass body is to be retained by using a mounter and the terminal electrode of the electronic component is to be mounted to a mount substrate such that the bottom surface of the glass body faces the mount substrate, an object may tend to come into contact with the electronic component at the bottom surface of the glass body. However, because the crystallized portion can be disposed away from the bottom surface, contact of the object with the crystallized portion can be reduced, thereby reducing the possibility of chipping and cracking of the crystallized portion.

Preferably, the electronic component according to an embodiment further includes an outer-surface conductor that is disposed above at least one of the top surface and the bottom surface and that is electrically connected to the through-conductor, and a protection layer provided above the at least one of the top surface and the bottom surface to cover the outer-surface conductor.

According to the above embodiment, the protection layer covers the outer-surface conductor, so as to be capable of protecting the outer-surface conductor. Furthermore, the protection layer covers at least one of the top surface and the bottom surface of the glass body, so as to be capable of protecting the glass body.

Preferably, a manufacturing method of an electronic component according to an embodiment includes a step for preparing a motherboard composed of photosensitive glass and including a first principal surface and a second principal surface; a step for irradiating a cutting region of the first principal surface with ultraviolet light and subsequently crystallizing the motherboard by heating to form a crystallized portion extending from the first principal surface to the second principal surface in a direction parallel to the first principal surface; a step for causing a part of the crystallized portion to remain in the cutting region while removing another part of the crystallized portion by etching to form a groove extending in a direction parallel to the first principal surface; a step for forming a through-conductor extending through the first principal surface and the second principal surface of the motherboard; a step for embedding a colored insulation layer within the groove and bringing the colored insulation layer into contact with the crystallized portion; and a step for splitting the motherboard into a plurality of electronic components by cutting the colored insulation layer and the crystallized portion along the cutting region.

According to the above embodiment, the motherboard is split by cutting the colored insulation layer and the crystallized portion along the cutting region, thereby facilitating the cutting process, as compared with a process involving cutting photosensitive glass. Furthermore, because the crystallized portion is in contact with the colored insulation layer, the crystallized portion is fixed to the colored insulation layer, thereby reducing the possibility of chipping and cracking of the crystallized portion during the cutting process of the colored insulation layer and the crystallized portion.

Moreover, since the colored insulation layer is provided in the state of the motherboard, a simple and low-cost process can be achieved, as compared with a case where the colored insulation layer is applied to each component after the splitting process of the motherboard. In contrast, if the colored insulation layer is to be applied to each split component, the time and effort and the cost required for the work increase.

Preferably, the manufacturing method of the electronic component according to an embodiment further includes a step for forming an outer-surface conductor electrically connected to the through-conductor above at least one of the first principal surface and the second principal surface; and a step for forming a protection layer above the at least one of the first principal surface and the second principal surface to cover the outer-surface conductor. The step for forming the outer-surface conductor and the step for forming the protection layer are performed prior to the step for splitting the motherboard into the plurality of electronic components.

According to the above embodiment, the protection layer covers the outer-surface conductor, so as to be capable of protecting the outer-surface conductor. Moreover, the protection layer covers at least one of the top surface and the bottom surface of the glass body, so as to be capable of protecting the glass body.

The electronic component and the manufacturing method thereof according to aspects of the present disclosure facilitate detection by a detector, such as a laser sensor or a camera.

DETAILED DESCRIPTION

Figure 1:
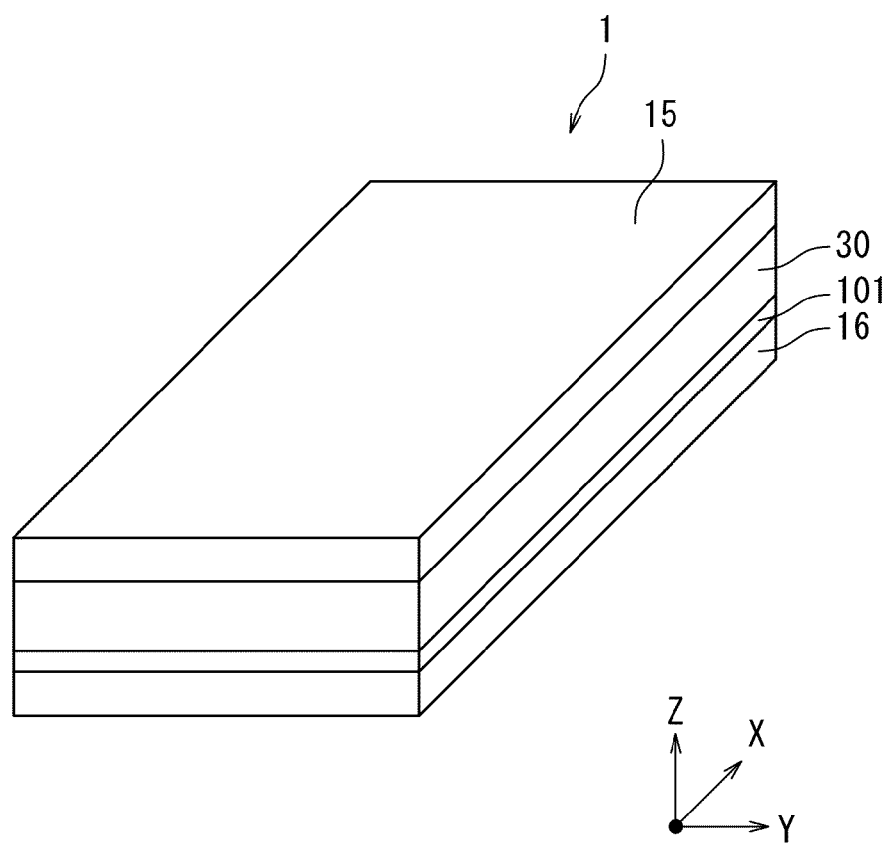
FIG. 1 is a perspective view illustrating an inductor component as an electronic component according to a first embodiment.

An electronic component and a manufacturing method thereof according to aspects of the present disclosure will be described in more detail below with reference to embodiments shown in the drawings. The drawings partially include schematic drawings and sometimes do not reflect the actual dimensions or scales.

First Embodiment

Configuration

Figure 2:
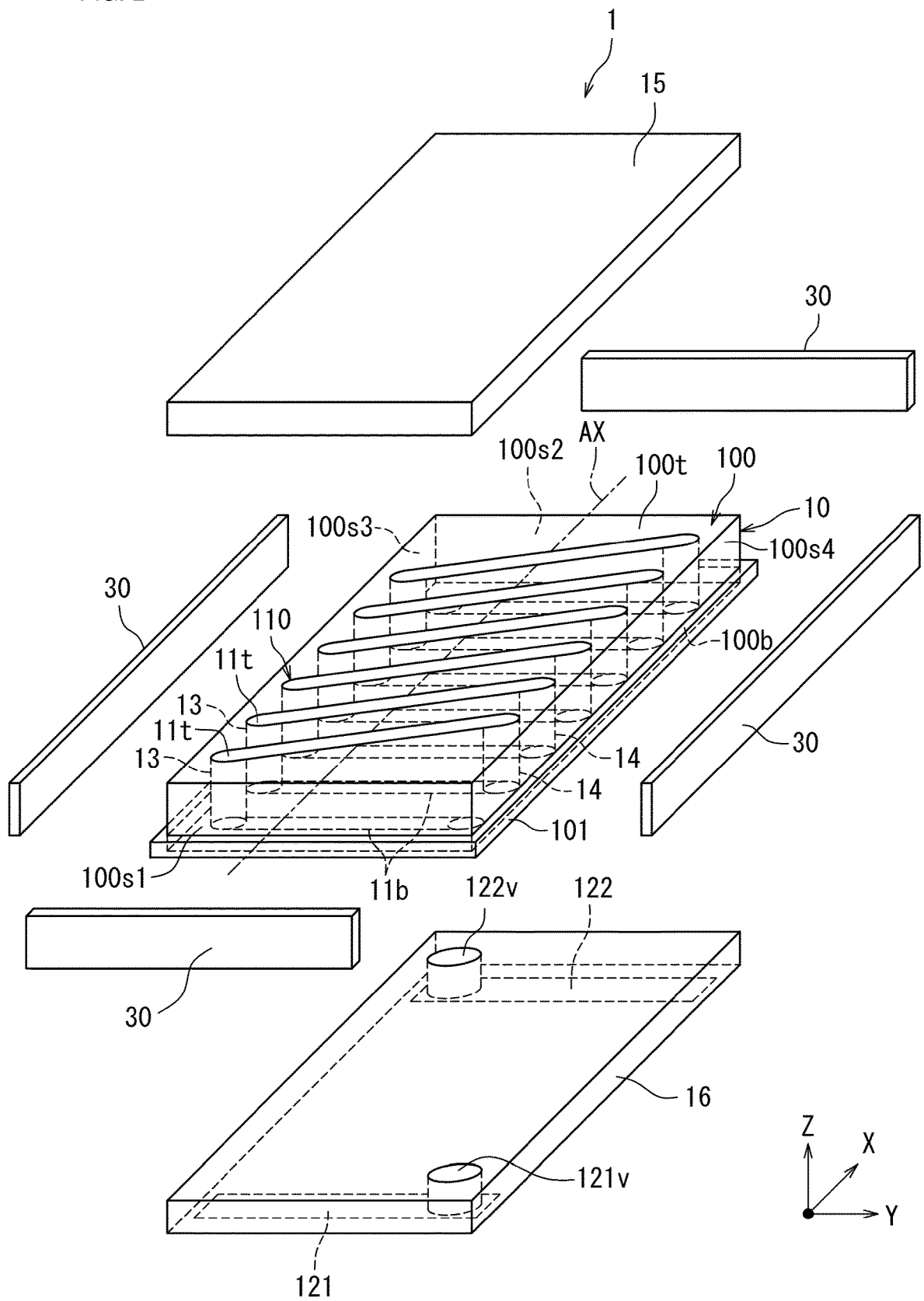
FIG. 2 is an exploded perspective view of the inductor component.
Figure 3:
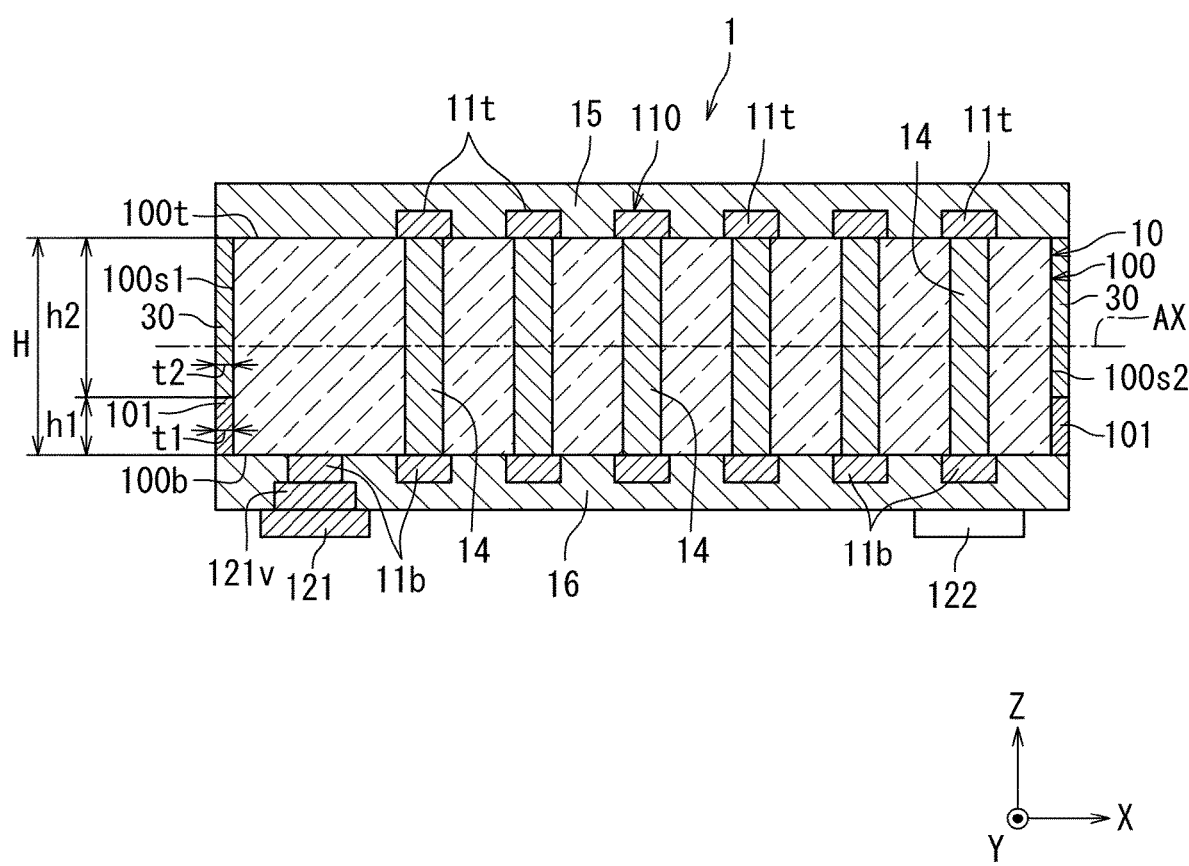
FIG. 3 is a cross-sectional view of the inductor component.
Figure 4A:
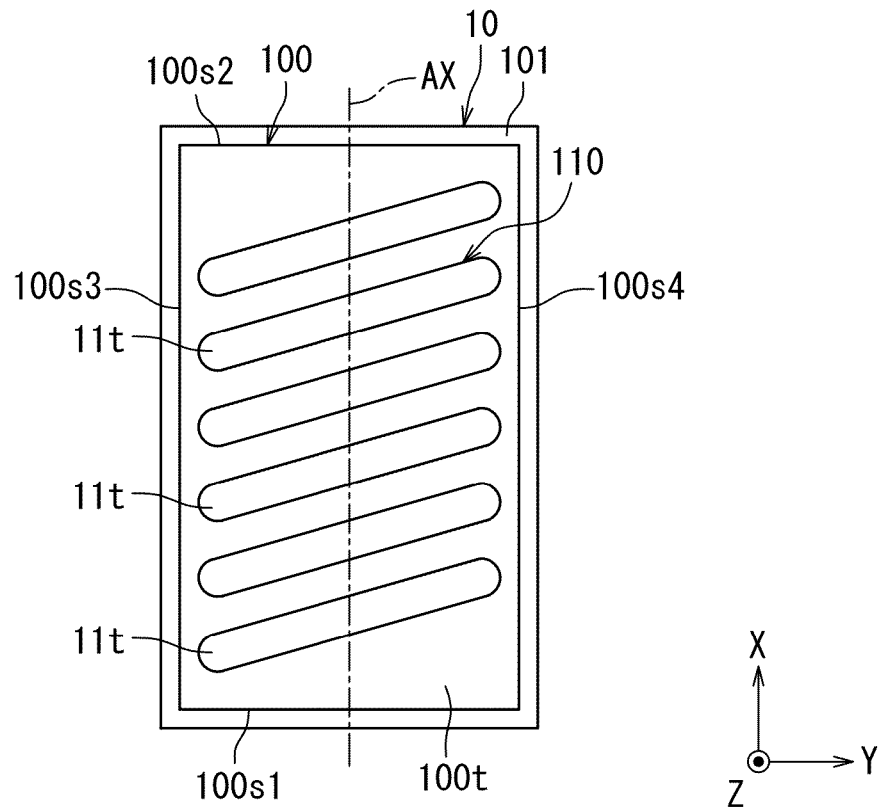
FIG. 4A is a top view of a coil of the inductor component, as viewed from a top surface thereof.
Figure 4B:
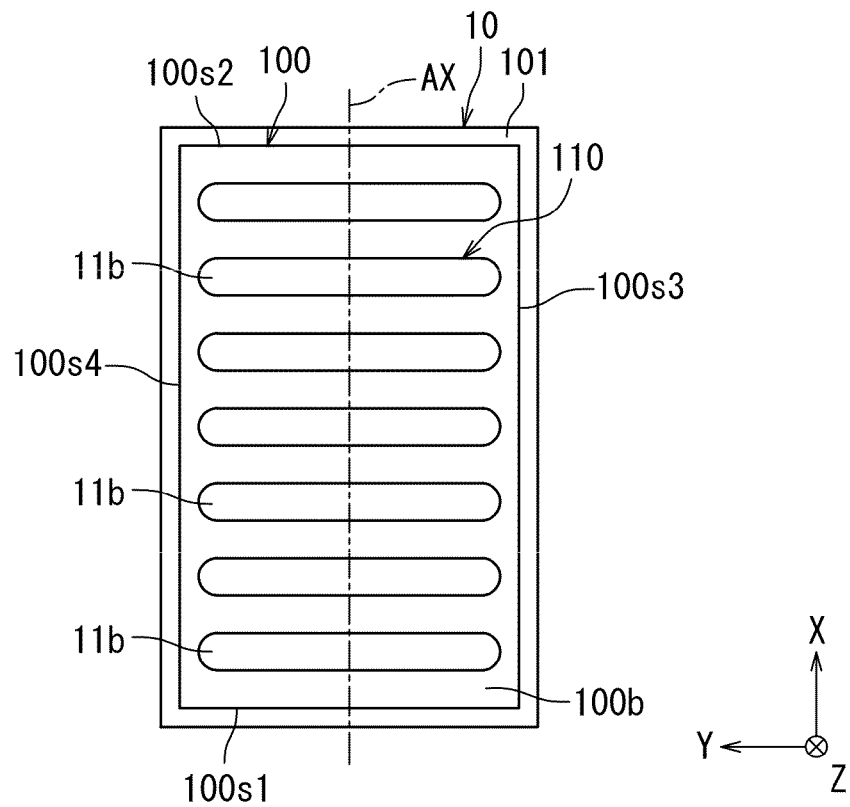
FIG. 4B is a bottom view of the coil of the inductor component, as viewed from a bottom surface thereof.

In a first embodiment, an electronic component according to the present disclosure is described as being an inductor component as an example. FIG. 1 is a perspective view of the inductor component, as viewed from a top surface thereof. FIG. 2 is an exploded perspective view of the inductor component, as viewed from the top surface thereof. FIG. 3 is a cross-sectional view of the inductor component. FIG. 4A is a top view of a coil of the inductor component, as viewed from the top surface thereof. FIG. 4B is a bottom view of the coil of the inductor component, as viewed from a bottom surface thereof.

An inductor component 1 is, for example, a surface-mounted inductor component used in a high-frequency-signal transmission circuit. As shown in FIGS. 1, 2, 3, 4A, and 4B, the inductor component 1 includes a glass substrate 10, a coil 110 provided in the glass substrate 10, a first protection layer 15 provided on the top surface of the glass substrate 10 and covering a portion of the coil 110, a second protection layer 16 provided on the bottom surface of the glass substrate 10 and covering a portion of the coil 110, a colored insulation layer 30 provided on the side surfaces of the glass substrate 10, and a first terminal electrode 121 and a second terminal electrode 122 that are provided on the second protection layer 16 and that are electrically connected to the coil 110.

The glass substrate 10 has a glass body 100 and a crystallized portion 101 protruding from the glass body 100. The glass body 100 is a rectangular parallelepiped having a length, a width, and a height. The glass body 100 has a first side surface 100s1 and a second side surface 100S2 that are located at opposite ends in the length direction, a third side surface 100s3 and a fourth side surface 100s4 that are located at opposite ends in the width direction, and a bottom surface 100b and a top surface 100t that are located at opposite ends in the height direction. In other words, the outer surfaces of the glass body 100 include the first side surface 100s1 and the second side surface 100s2, the third side surface 100s3 and the fourth side surface 100s4, and the bottom surface 100b and the top surface 100t. The bottom surface 100b faces a mount substrate when the inductor component 1 is mounted to the mount substrate.

As shown in the drawings, a direction corresponding to the length direction (longitudinal direction) of the glass body 100 and extending from the first side surface 100s1 toward the second side surface 100s2 is defined as an X direction for the sake of convenience. A direction corresponding to the width direction of the glass body 100 and extending from the third side surface 100s3 toward the fourth side surface 100s4 is defined as a Y direction. A direction corresponding to the height direction of the glass body 100 and extending from the bottom surface 100b toward the top surface 100t is defined as a Z direction. The X direction, the Y direction, and the Z direction are orthogonal to one another and constitute a left-handed system when arranged in the following order: X, Y, and Z.

In this description, the outer surfaces of the glass body 100 do not simply imply that the outer surfaces are oriented toward the outer periphery of the glass body 100, but serve as boundaries between the outside and the inside of the glass body 100. Furthermore, the expression "above an outer surface (top surface, bottom surface, or side surface) of the glass body 100" does not refer to one absolute direction, as in orthogonally above, defined by the gravitational direction, but refers to an outward-extending direction, of the outside and the inside separated from each other by the outer surface serving as a boundary, with reference to the outer surface. Therefore, the expression "above an outer surface" refers to a relative direction defined in accordance with the orientation of the outer surface. Moreover, the expression "above" relative to a certain element includes not only a position above and distant from the element, that is, a position above the element with another object interposed therebetween or a position above the element with a distance therebetween, but also a position directly on and in contact with the element.

The glass substrate 10 has insulation properties. The glass substrate 10 is preferably, for example, a photosensitive glass substrate represented by Foturan II (registered trademark of Schott AG). In particular, the glass substrate 10 preferably contains a cerium oxide (ceria: $CeO_2$). In this case, the cerium oxide acts as a sensitizer to facilitate a photolithography-based process.

However, since the glass substrate 10 can be processed by machining, such as drilling or sandblasting, by dry/wet etching using a photoresist, a metal mask, and so on, or by laser processing, the glass substrate 10 may be a glass substrate not having photosensitivity. The glass substrate 10 may be formed by sintering a glass paste, or may be formed by using a known technique, such as a float process.

The glass body 100 is a non-crystallized amorphous portion of the glass substrate 10. The glass body 100 has high transparency. The crystallized portion 101 is a crystallized portion of the glass substrate 10. The transparency of the crystallized portion 101 is lower than the transparency of the glass body 100. With the crystallized portion 101 provided, the effective permittivity of the glass substrate 10 can be adjusted. Specifically, stray capacitance occurring between any of the conductors 11b, 11t, 13, and 14, the terminal electrodes 121 and 122, and a wiring pattern of the mount substrate can be increased or decreased. In particular, the self-resonant frequency of the inductor component 1 can be adjusted. For example, in the case of Foturan II mentioned above, the permittivity of the glass body 100 is 6.4, whereas the permittivity of the crystallized portion 101 can be reduced to 5.8. Accordingly, the stray capacitance between the conductors near the crystallized portion 101 can be decreased.

The crystallized portion 101 is provided to surround the first side surface 100s1 to the fourth side surface 100s4 of the glass body 100. In detail, as viewed from a direction orthogonal to the first side surface 100s1, the crystallized portion 101 extends in the Y direction (corresponding to an example of a "first direction" defined in the claims) that is parallel to the bottom surface 100b. Likewise, as viewed from a direction orthogonal to the second side surface 100s2, the crystallized portion 101 extends in the Y direction that is parallel to the bottom surface 100b. Moreover, as viewed from a direction orthogonal to the third side surface 100s3, the crystallized portion 101 extends in the X direction that is parallel to the bottom surface 100b. As viewed from a direction orthogonal to the fourth side surface 100s4, the crystallized portion 101 extends in the X direction that is parallel to the bottom surface 100b.

At least one side surface of the first side surface 100s1 to the fourth side surface 100s4 may be provided with the crystallized portion 101. In this case, the at least one side surface corresponds to an example of a "first side surface" defined in the claims. Furthermore, one side surface, such as the first side surface 100s1, may have a single crystallized portion 101 or a plurality of crystallized portions 101.

Furthermore, although one side surface, such as the first side surface 100s1, has the crystallized portion 101 extending continuously between the left and right ends in the Y direction, the crystallized portion 101 may exist partially in the Y direction (left-right direction). In other words, the length of the crystallized portion 101 in the Y direction may be smaller than the length between the left and right ends of the first side surface 100s1.

Furthermore, as viewed from a direction orthogonal to one side surface, such as the first side surface 100s1, the extending direction of the crystallized portion 101 is completely aligned with the Y direction. Alternatively, the extending direction of the crystallized portion 101 may be substantially aligned with the Y direction. For example, an inclination angle formed between the extending direction of the crystallized portion 101 and the Y direction may be 10° or smaller.

As an alternative to being a rectangular parallelepiped, the glass body 100 may be a circular cylinder. In this case, the peripheral surface of the circular cylinder corresponds to an example of a "first side surface" defined in the claims. At least a portion of the peripheral surface of the circular cylinder is provided with the crystallized portion 101.

The coil 110 is helically wound along an axis AX. The axis AX of the coil 110 is disposed parallel to the bottom surface 100b. The coil 110 includes a plurality of bottom-surface conductors 11b, a plurality of top-surface conductors 11t, a plurality of first through-conductors 13, and a plurality of second through-conductors 14. The bottom-surface conductors 11b and the top-surface conductors 11t each correspond to an example of an "outer-surface conductor" defined in the claims.

The plurality of bottom-surface conductors 11b are disposed above the bottom surface 100b. The plurality of bottom-surface conductors 11b are arranged in contact with the bottom surface 100b along the axis AX. The plurality of top-surface conductors 11t are disposed above the top surface 100t. The plurality of top-surface conductors 11t are arranged in contact with the top surface 100t along the axis AX.

The plurality of first through-conductors 13 are provided within the glass body 100 and extend through the bottom surface 100b and the top surface 100t. The plurality of first through-conductors 13 extend from the bottom-surface conductors 11b toward the top-surface conductors 11t and are arranged along the axis AX.

The plurality of second through-conductors 14 are provided within the glass body 100 and extend through the bottom surface 100b and the top surface 100t. The plurality of second through-conductors 14 extend from the bottom-surface conductors 11b toward the top-surface conductors 11t and are arranged along the axis AX. The second through-conductors 14 are provided opposite the first through-conductors 13 relative to the axis AX. The bottom-surface conductors 11b, the first through-conductors 13, the top-surface conductors 11t, and the second through-conductors 14 are electrically connected in this order, and constitute at least a portion of the helical coil 110.

The top-surface conductors 11t extend in the Y direction while being slightly inclined in the X direction. The top-surface conductors 11t are all disposed parallel to each other in the X direction. The bottom-surface conductors 11b extend in the Y direction. The bottom-surface conductors 11b are all disposed parallel to each other in the X direction.

The first through-conductors 13 are disposed toward the third side surface 100s3 relative to the axis AX within through-holes in the glass body 100. The second through-conductors 14 are disposed toward the fourth side surface 100s4 relative to the axis AX within through-holes in the glass body 100. The first through-conductors 13 and the second through-conductors 14 extend in a direction orthogonal to the bottom surface 100b and the top surface 100t. All the first through-conductors 13 and all the second through-conductors 14 are disposed parallel to each other in the X direction.

The bottom-surface conductors 11b and the top-surface conductors 11t are composed of a conductive material, such as copper, silver, gold, or an alloy thereof. The bottom-surface conductors 11b and the top-surface conductors 11t may each be a metallic film formed by, for example, plating, deposition, or sputtering, or may each be a metal sintered body formed by applying and sintering a conductive paste. The material of the first through-conductors 13 and the second through-conductors 14 is the same as the material of the bottom-surface conductors 11b and the top-surface conductors 11t.

The bottom-surface conductors 11b and the top-surface conductors 11t are preferably formed by a semi-additive process, so that low-electrical-resistance, high-precision, and high-aspect bottom-surface conductors 11b and top-surface conductors 11t can be formed. The first through-conductors 13 and the second through-conductors 14 can be formed within through-holes preliminarily formed in the glass body 100 by using the same material and the same manufacturing method used for the bottom-surface conductors 11b and the top-surface conductors 11t.

The first protection layer 15 is disposed above the top surface 100t to cover the top-surface conductors 11t. The first protection layer 15 is in contact with the top surface 100t and the top-surface conductors 11t. The first protection layer 15 covers the top-surface conductors 11t so as to protect the top-surface conductors 11t from an external force and to prevent the top-surface conductors 11t from being damaged. Furthermore, because the first protection layer 15 covers the top surface 100t of the glass body 100, the first protection layer 15 can protect the glass body 100.

The second protection layer 16 is disposed above the bottom surface 100b to cover the bottom-surface conductors 11b. The second protection layer 16 is in contact with the bottom surface 100b and the bottom-surface conductors 11b. The second protection layer 16 covers the bottom-surface conductors 11b so as to protect the bottom-surface conductors 11b from an external force and to prevent the bottom-surface conductors 11b from being damaged. Furthermore, because the second protection layer 16 covers the bottom surface 100b of the glass body 100, the second protection layer 16 can protect the glass body 100.

The first protection layer 15 and the second protection layer 16 have insulation properties and are each composed of, for example, resin, such as epoxy or polyimide.

The first terminal electrode 121 is disposed above the bottom surface 100b and is connected to a first end of the coil 110. The second terminal electrode 122 is disposed above the bottom surface 100b and is connected to a second end of the coil 110. The first terminal electrode 121 is provided on the second protection layer 16 toward the first side surface 100s1 relative to the center of the glass substrate 10 in the X direction. The second terminal electrode 122 is provided on the second protection layer 16 toward the second side surface 100s2 relative to the center of the glass substrate 10 in the X direction.

The first terminal electrode 121 is connected to the bottom-surface conductors 11b by a first via conductor 121v embedded in the second protection layer 16. The second terminal electrode 122 is connected to the bottom-surface conductors 11b by a second via conductor 122v embedded in the second protection layer 16.

The first terminal electrode 121 has a foundation layer and a plating layer covering the foundation layer. The foundation layer contains a conductive material, such as Ag or Cu. The plated layer contains a conductive material, such as Ni, Sn, Pd, or Au. Likewise, the second terminal electrode 122 has a foundation layer and a plating layer covering the foundation layer. The first terminal electrode 121 and the second terminal electrode 122 may be composed of a single-layer conductor material.

The colored insulation layer 30 is provided to surround the first side surface 100s1 to the fourth side surface 100s4 of the glass body 100. In detail, as viewed from the direction orthogonal to the first side surface 100s1, the colored insulation layer 30 extends in the Y direction (corresponding to an example of a "first direction" defined in the claims) that is orthogonal to the bottom surface 100b and is disposed adjacent to the crystallized portion 101 in the Z direction (corresponding to an example of a "second direction" defined in the claims) that is orthogonal to the Y direction. In other words, the colored insulation layer 30 is in contact with the crystallized portion 101 in the Y direction. Likewise, as viewed from the direction orthogonal to the second side surface 100s2, the colored insulation layer 30 extends in the Y direction that is orthogonal to the bottom surface 100*b* and is disposed adjacent to the crystallized portion 101 in the Z direction that is orthogonal to the Y direction.

Moreover, as viewed from the direction orthogonal to the third side surface 100*s*3, the colored insulation layer 30 extends in the X direction that is parallel to the bottom surface 100*b* and is disposed adjacent to the crystallized portion 101 in the Z direction that is orthogonal to the X direction. As viewed from the direction orthogonal to the fourth side surface 100*s*4, the colored insulation layer 30 extends in the X direction that is parallel to the bottom surface 100*b* and is disposed adjacent to the crystallized portion 101 in the Z direction that is orthogonal to the X direction.

The colored insulation layer 30 has insulation properties and is composed of, for example, resin, such as epoxy or polyimide. The colored insulation layer 30 has a color, such as green or blue, and the transparency of the colored insulation layer 30 is lower than the transparency of the glass body 100.

At least one side surface of the first side surface 100*s*1 to the fourth side surface 100*s*4 may be provided with the colored insulation layer 30. In this case, the at least one side surface corresponds to an example of a "first side surface" defined in the claims. In other words, as viewed in a direction orthogonal to the first side surface, at least a portion of the colored insulation layer 30 extends in the first direction that is parallel to the bottom surface 100*b* and is disposed adjacent to the crystallized portion 101 in the second direction that is orthogonal to the first direction. Furthermore, the colored insulation layer 30 on each side surface, such as the first side surface 100*s*1, may be split into a plurality of regions.

Furthermore, although one side surface, such as the first side surface 100*s*1, has the colored insulation layer 30 extending continuously between the left and right ends in the Y direction, the colored insulation layer 30 may extend partially in the Y direction (left-right direction). In other words, the length of the colored insulation layer 30 in the Y direction may be smaller than the length between the left and right ends of the first side surface 100*s*1.

Furthermore, as viewed from the direction orthogonal to one side surface, such as the first side surface 100*s*1, the extending direction of the colored insulation layer 30 is completely aligned with the Y direction. Alternatively, the extending direction of the colored insulation layer 30 may be substantially aligned with the Y direction. For example, an inclination angle formed between the extending direction of the colored insulation layer and the Y direction may be 10° or smaller.

As an alternative to being a rectangular parallelepiped, the glass body 100 may be a circular cylinder. In this case, the peripheral surface of the circular cylinder corresponds to an example of a "first side surface" defined in the claims. A portion of the peripheral surface of the circular cylinder is provided with the colored insulation layer 30.

According to the above configuration, the first side surface 100*s*1 of the glass body 100 is provided with the crystallized portion 101 and the colored insulation layer 30, so that when the inductor component 1 is to be detected from the first side surface 100*s*1 of the glass body 100 by using a detector, such as a laser sensor or a camera, the crystallized portion 101 and the colored insulation layer 30 with low transparency can be readily recognized, whereby the inductor component 1 can be readily detected.

Furthermore, as viewed from the direction orthogonal to the first side surface 100*s*1, the crystallized portion 101 and the colored insulation layer 30 extend in the Y direction. Thus, when the inductor component 1 is to be detected by scanning the detector in the Y direction, the crystallized portion 101 or the colored insulation layer 30 can be readily recognized, whereby the inductor component 1 can be readily detected.

Moreover, because the first side surface 100*s*1 of the glass body 100 is provided with the crystallized portion 101 and the colored insulation layer 30, the exposed area of the glass body 100 can be reduced, and the mechanical strength of the inductor component 1 against an external force can be increased. The mechanical strength of crystallized glass is higher than the mechanical strength of non-crystallized glass.

The second side surface 100*s*2, the third side surface 100*s*3, and the fourth side surface 100*s*4 have advantages similar to the above-described advantages of the first side surface 100*s*1.

Preferably, the area where the first side surface 100*s*1 is not provided with the crystallized portion 101 is entirely provided with the colored insulation layer 30. According to this configuration, the entire area of the first side surface 100*s*1 can be covered with the crystallized portion 101 and the colored insulation layer 30. Accordingly, the inductor component 1 can be detected more readily by the detector, and the mechanical strength of the inductor component 1 can be further increased. The second side surface 100*s*2, the third side surface 100*s*3, and the fourth side surface 100*s*4 have configurations and advantages similar to those of the first side surface 100*s*1.

Preferably, as shown in FIG. 3, at the first side surface 100*s*1, a thickness t1 of the crystallized portion 101 in the direction (X direction) orthogonal to the first side surface 100*s*1 and a thickness t2 of the colored insulation layer 30 in the direction (X direction) orthogonal to the first side surface 100*s*1 are equal to each other. The term "thickness" refers to an average thickness, and is specifically an average value when a plurality of points are measured in a cross section including the direction (X direction) orthogonal to the first side surface 100*s*1 and the second direction (Z direction).

According to the above configuration, the crystallized portion 101 and the colored insulation layer 30 can be made flush with each other in the direction orthogonal to the first side surface 100*s*1. Accordingly, a step between the crystallized portion 101 and the colored insulation layer 30 in the direction orthogonal to the first side surface 100*s*1 can be eliminated, and the possibility of delamination of the colored insulation layer 30 as well as chipping and cracking of the crystallized portion 101 as a result of coming into contact with an object can be reduced. The second side surface 100*s*2, the third side surface 100*s*3, and the fourth side surface 100*s*4 have configurations and advantages similar to those of the first side surface 100*s*1.

Preferably, as shown in FIG. 3, at the first side surface 100*s*1, a height h1 of the crystallized portion 101 in the second direction (Z direction) is smaller than a height h2 of the colored insulation layer 30 in the second direction (Z direction). The term "height" refers to a maximum height, and is specifically an average value when measured in a cross section including the direction orthogonal to the first side surface 100*s*1 and the second direction (Z direction).

According to the above configuration, the crystallized portion 101 can be made smaller, so that the possibility of an object coming into contact with the crystallized portion 101 can be reduced, thereby reducing the possibility of chipping and cracking of the crystallized portion 101. Moreover, the possibility of an occurrence of stray capacitance can be reduced at the crystallized portion 101. Furthermore, since the colored insulation layer 30 can be made larger, the mechanical strength of the inductor component 1 can be increased. The second side surface 100s2, the third side surface 100s3, and the fourth side surface 100s4 have configurations and advantages similar to those of the first side surface 100s1.

Preferably, as shown in FIG. 3, at the first side surface 100s1, the relationship between the height h1 of the crystallized portion 101 in the second direction (Z direction) and a height H of the first side surface 100s1 in the second direction (Z direction) satisfies $\frac{1}{5} < h1/H < \frac{1}{2}$.

According to the above configuration, because $h1/H < \frac{1}{2}$ is satisfied, the crystallized portion 101 is prevented from being larger than necessary, so that the possibility of an object coming into contact with the crystallized portion 101 can be reduced, whereby the possibility of chipping and cracking of the crystallized portion 101 can be reduced. Moreover, the possibility of an occurrence of stray capacitance can be reduced at the crystallized portion 101. On the other hand, because $\frac{1}{5} < h1/H$ is satisfied, the crystallized portion 101 is prevented from being smaller than necessary, so that the mechanical strength of the crystallized portion 101 can be ensured. The second side surface 100s2, the third side surface 100s3, and the fourth side surface 100s4 have configurations and advantages similar to those of the first side surface 100s1.

Preferably, as shown in FIG. 2 and FIG. 3, at the first side surface 100s1, the crystallized portion 101 is disposed toward the bottom surface 100b relative to the colored insulation layer 30.

According to the above configuration, the crystallized portion 101 can be disposed away from the top surface 100t, so that the possibility of an occurrence of stray capacitance can be reduced near the top-surface conductors 11t disposed on the top surface 100t.

The terminal electrodes 121 and 122 of the inductor component 1 are mounted to a mount substrate such that the bottom surface 100b of the glass body 100 faces the mount substrate. In this state, although an object tends to come into contact with the inductor component 1 at the top surface 100t of the glass body 100, since the crystallized portion 101 is disposed toward the bottom surface 100b, contact of the object with the crystallized portion 101 can be reduced, thereby reducing the possibility of chipping and cracking of the crystallized portion 101. The second side surface 100s2, the third side surface 100s3, and the fourth side surface 100s4 have configurations and advantages similar to those of the first side surface 100s1.

Preferably, as shown in FIG. 3, at the first side surface 100s1, the first protection layer 15 is in contact with the colored insulation layer 30, and the second protection layer 16 is in contact with the crystallized portion 101. In detail, as viewed from above in the Z direction, the first protection layer 15 covers the colored insulation layer 30. A side surface of the first protection layer 15 located in the direction orthogonal to the Z direction and a side surface of the colored insulation layer 30 located in the direction orthogonal to the Z direction are positioned in the same plane. As viewed from below in the Z direction, the second protection layer 16 covers the crystallized portion 101. A side surface of the second protection layer 16 located in the direction orthogonal to the Z direction and a side surface of the crystallized portion 101 located in the direction orthogonal to the Z direction are positioned in the same plane.

According to the above configuration, the colored insulation layer 30 and the crystallized portion 101 are fixed to the first protection layer 15 and the second protection layer 16. When the colored insulation layer 30 and the crystallized portion 101 are to be cut, the possibility of delamination of the colored insulation layer 30 as well as chipping and cracking of the crystallized portion 101 can be reduced. The second side surface 100s2, the third side surface 100s3, and the fourth side surface 100s4 have configurations and advantages similar to those of the first side surface 100s1. The first protection layer 15 and the second protection layer 16 may be in contact with one of the colored insulation layer 30 and the crystallized portion 101.

Preferably, at least one of the first protection layer 15 and the second protection layer 16 is colored, similar to the colored insulation layer 30. Accordingly, when the inductor component 1 is to be detected from the top surface 100t or the bottom surface 100b of the glass body 100 by using the detector, such as a laser sensor or a camera, the protection layer 15 or 16 can be readily recognized, whereby the inductor component 1 can be readily detected.

Manufacturing Method of Inductor Component 1

Figure 5A:
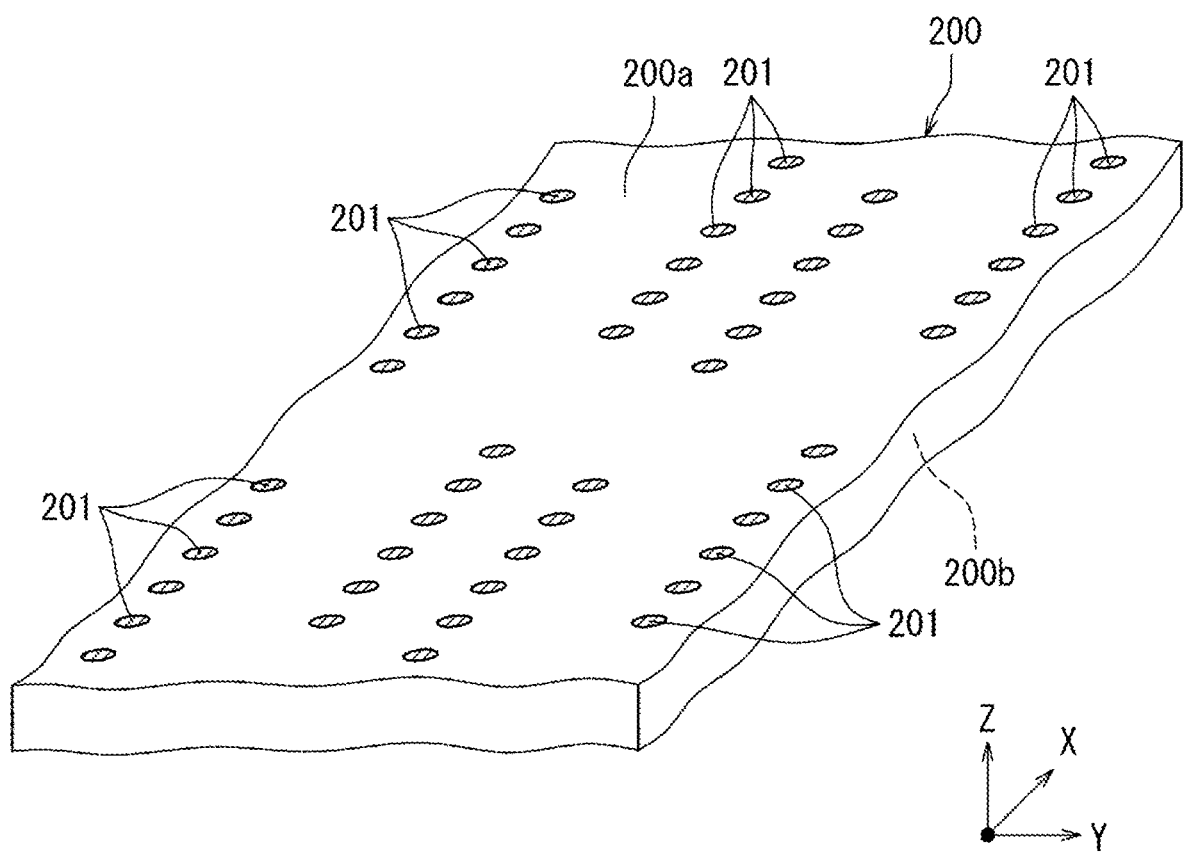
FIG. 5A is a perspective view explaining a manufacturing method of the inductor component.

As shown in FIG. 5A, a motherboard 200 composed of photosensitive glass and including a first principal surface 200a and a second principal surface 200b is prepared. The first principal surface 200a corresponds to the top surface 100t, and the second principal surface 200b corresponds to the bottom surface 100b. An example of the motherboard 200 that can be used is Foturan II. The motherboard 200 normally contains, for example, a silicon, lithium, aluminum, or cerium oxide so as to be adaptable to precise photolithography.

Through-conductor formation regions 201 on the first principal surface 200a are irradiated with ultraviolet light. Subsequently, the motherboard 200 is crystallized by being heated (e.g., sintered), thereby forming crystallized portions extending from the first principal surface 200a to the second principal surface 200b. The through-conductor formation regions 201 are regions where through-conductors are to be formed, and are hatched in FIG. 5A. In detail, the motherboard 200 is irradiated with ultraviolet light with a wavelength of about 310 nm. As a result of the ultraviolet irradiation, for example, metallic ions, such as cerium ions, in the photosensitive glass are oxidized by light energy, thereby releasing electrons. The processing depth to be ultimately obtained in the motherboard 200 can be controlled by adjusting the irradiation amount of the ultraviolet light in accordance with the thickness of the motherboard 200.

An exposure device used for the ultraviolet irradiation may be a contact aligner or a stepper from which ultraviolet light with a wavelength of about 310 nm can be obtained. Alternatively, a laser irradiation device, including a femtosecond laser, may be used as a light source. If a femtosecond laser is used, the laser light is collected inside the motherboard 200, so that electrons can be released from a metal oxide in the light collected area alone. Specifically, the surface of the laser-irradiated area of the motherboard 200 is not photosensitive, whereas the inside thereof alone is photosensitive.

Figure 5B:
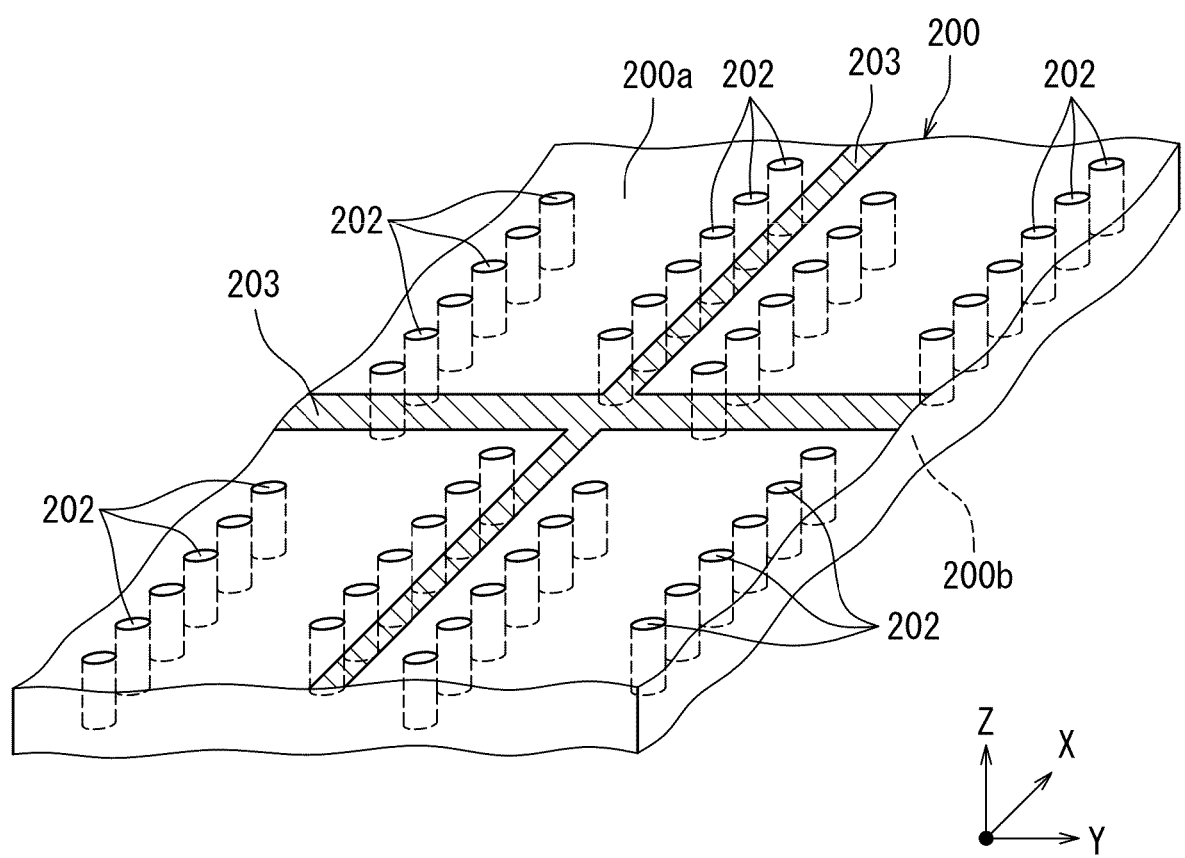
FIG. 5B is a perspective view explaining the manufacturing method of the inductor component.

As shown in FIG. 5B, in the through-conductor formation regions 201, the crystallized portions are entirely removed by etching, thereby forming through-holes 202 extending in the Z direction through the first principal surface 200a and the second principal surface 200b. For example, a hydrofluoric acid solution is used for the etching. The concentration of the hydrofluoric acid solution preferably ranges between, for example, 5% and 10%. In the etching process, the motherboard 200 is entirely immersed in the hydrofluoric acid solution. Accordingly, only the crystal phase in the board is etched, so that the through-holes 202 are formed.

Subsequently, a cutting region 203 of the first principal surface 200a is irradiated with ultraviolet light. Then, the motherboard 200 is crystallized by being heated (e.g., sintered), thereby forming a crystallized portion extending from the first principal surface 200a to the second principal surface 200b. The cutting region 203 is where a groove is to be formed, and is hatched in FIG. 5B. The cutting region 203 is aligned with a cutting line to be used when the motherboard 200 is split into individual pieces.

Figure 5C:
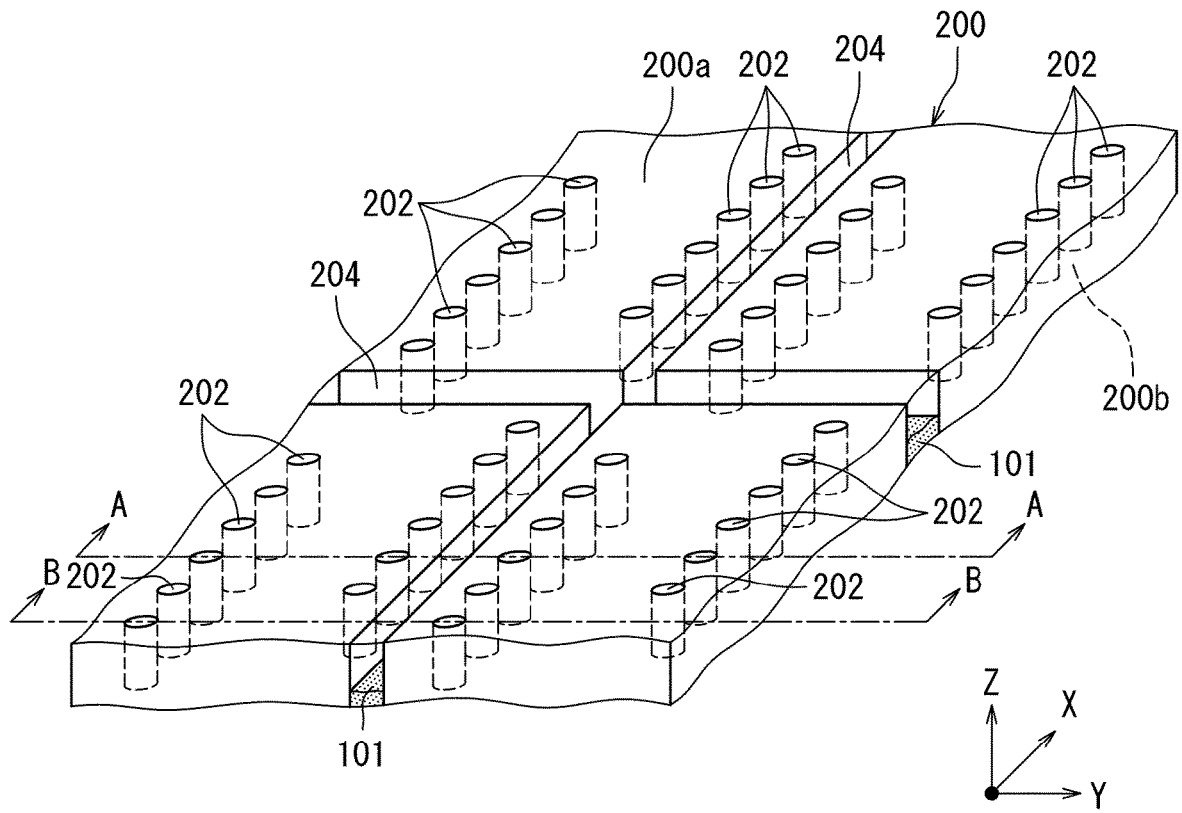
FIG. 5C is a perspective view explaining the manufacturing method of the inductor component.
Figure 5D:
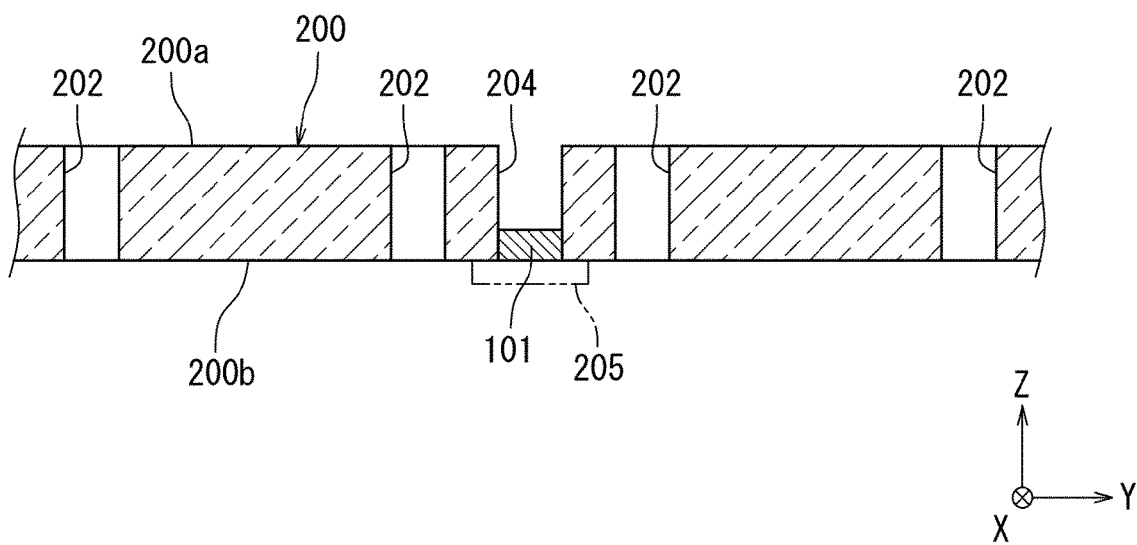
FIG. 5D is a cross-sectional view explaining the manufacturing method of the inductor component.

As shown in FIGS. 5C and 5D, in the cutting region 203, one part of the crystallized portion remains while the other part of the crystallized portion is removed by etching, thereby forming a groove 204 extending in a direction parallel to the first principal surface 200a. The remaining non-removed crystallized portion 101 is located toward the second principal surface 200b and serves as the bottom of the groove 204. A portion of the motherboard 200 other than the crystallized portion 101 corresponds to the glass body 100 in FIG. 1. In FIG. 5C, the crystallized portion 101 is hatched with dots. FIG. 5D is a cross-sectional view taken along line A-A in FIG. 5C. FIG. 5E to FIG. 5H similarly correspond to the cross-sectional view taken along line A-A in FIG. 5C.

When etching is performed such that a part (crystallized portion 101) of the crystallized portion remains, for example, the part that is to serve as the crystallized portion 101 may be covered with the protection film 205, which is resistant to the hydrofluoric acid solution, from the second principal surface 200b such that the hydrofluoric acid solution is not immersed in the crystal phase. In FIG. 5D, the protection film 205 is indicated with a double-dot chain line.

The through-conductor formation regions 201 and the cutting region 203 may be crystallized simultaneously, the protection film 205 may be provided only on the part that is to serve as the crystallized portion 101, and the unwanted crystallized portion may be etched at the same time. Accordingly, the through-holes 202 and the groove 204 can be formed simultaneously.

Figure 5E:
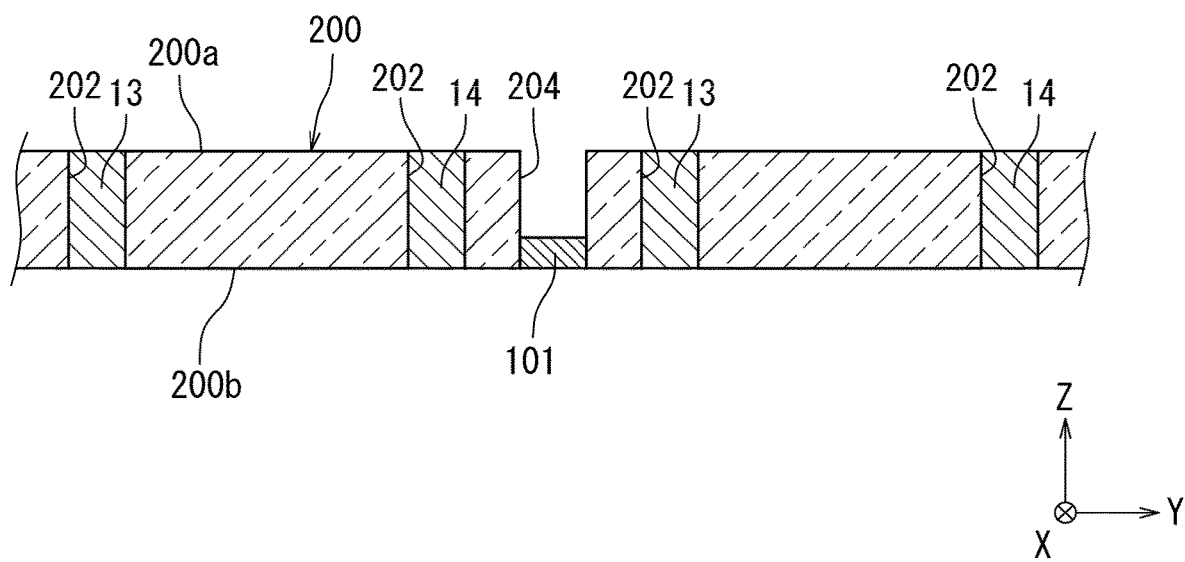
FIG. 5E is a cross-sectional view explaining the manufacturing method of the inductor component.

As shown in FIG. 5E, the through-conductors 13 and 14 extending through the first principal surface 200a and the second principal surface 200b of the motherboard 200 are formed. In detail, the first through-conductors 13 and the second through-conductors 14 are formed in the through-holes 202 by, for example, a semi-additive process. The through-conductors 13 and 14 may be formed of a single seed layer, or may be formed in different processes.

Figure 5F:
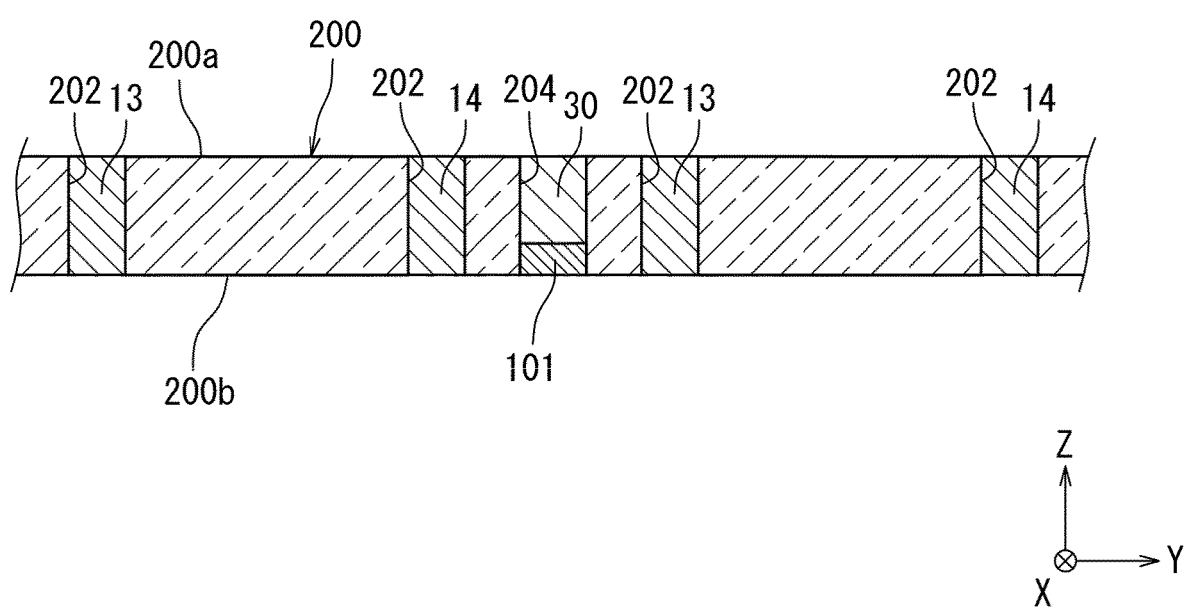
FIG. 5F is a cross-sectional view explaining the manufacturing method of the inductor component.

As shown in FIG. 5F, the colored insulation layer 30 is embedded within the groove 204, and the colored insulation layer 30 is brought into contact with the crystallized portion 101. In detail, the colored insulation layer 30 is formed within the groove 204 by, for example, spin coating. Alternatively, the colored insulation layer 30 may be provided over the first principal surface 200a while also being provided within the groove 204, and the colored insulation layer 30 on the first principal surface 200a may be subsequently removed by, for example, grinding.

Figure 5G:
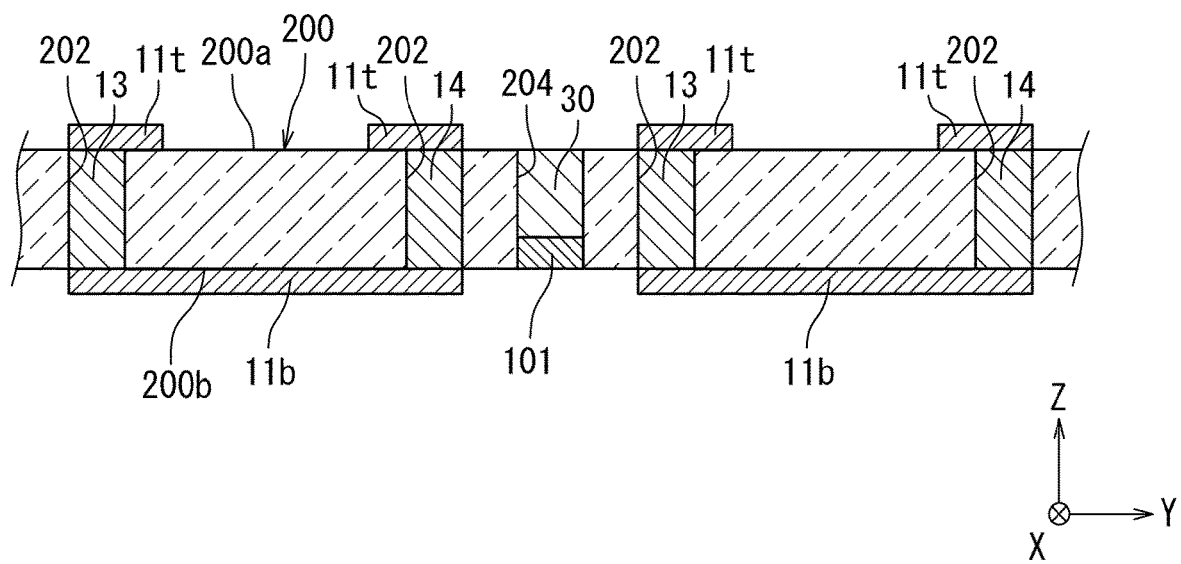
FIG. 5G is a cross-sectional view explaining the manufacturing method of the inductor component.

As shown in FIG. 5G, the top-surface conductors 11t electrically connected to the through-conductors 13 and 14 are formed on the first principal surface 200a, and the bottom-surface conductors 11b electrically connected to the through-conductors 13 and 14 are formed on the second principal surface 200b. For example, similar to the through-conductors 13 and 14, the top-surface conductors 11t and the bottom-surface conductors 11b are formed by a semi-additive process.

Figure 5H:
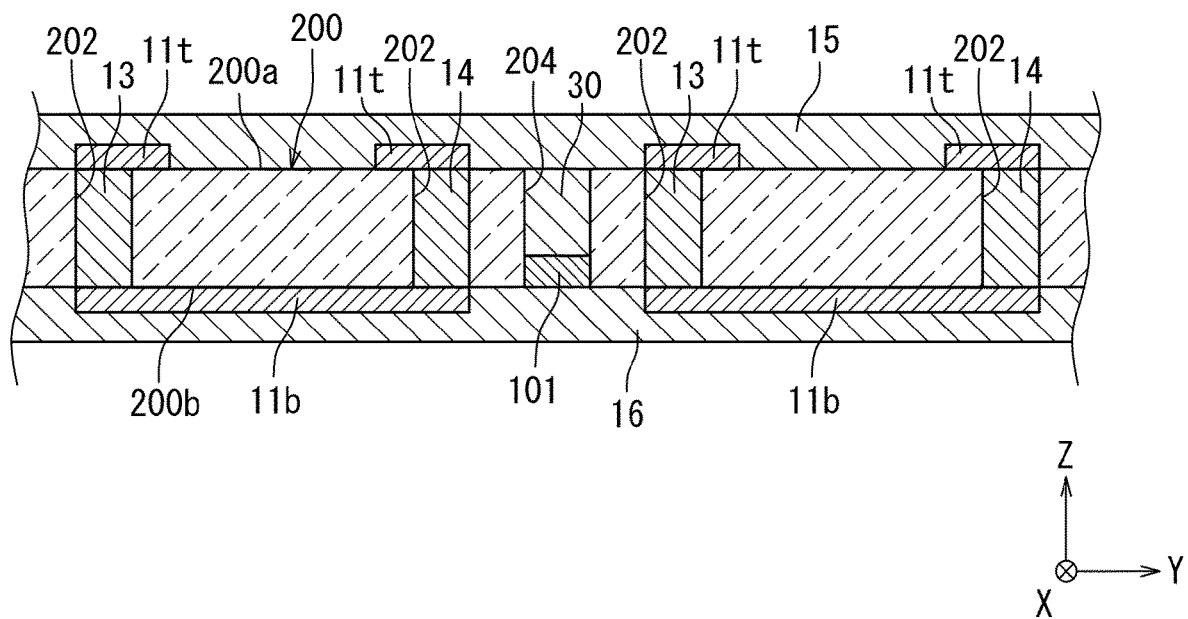
FIG. 5H is a cross-sectional view explaining the manufacturing method of the inductor component.

As shown in FIG. 5H, the first protection layer 15 is formed above the first principal surface 200a to cover the top-surface conductors 11t, and the second protection layer 16 is formed above the second principal surface 200b to cover the bottom-surface conductors 11b. In detail, the first protection layer 15 and the second protection layer 16 are each formed by laminating a resin film or by, for example, applying and thermally curing a resin paste.

Figure 5I:
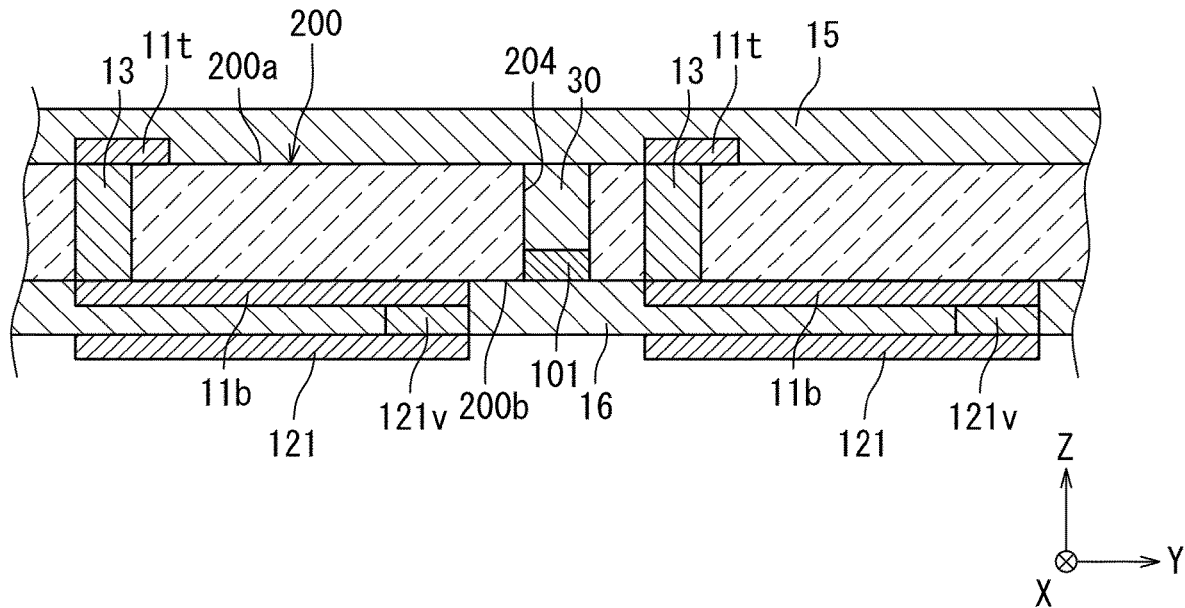
FIG. 5I is a cross-sectional view explaining the manufacturing method of the inductor component.
Figure 5J:
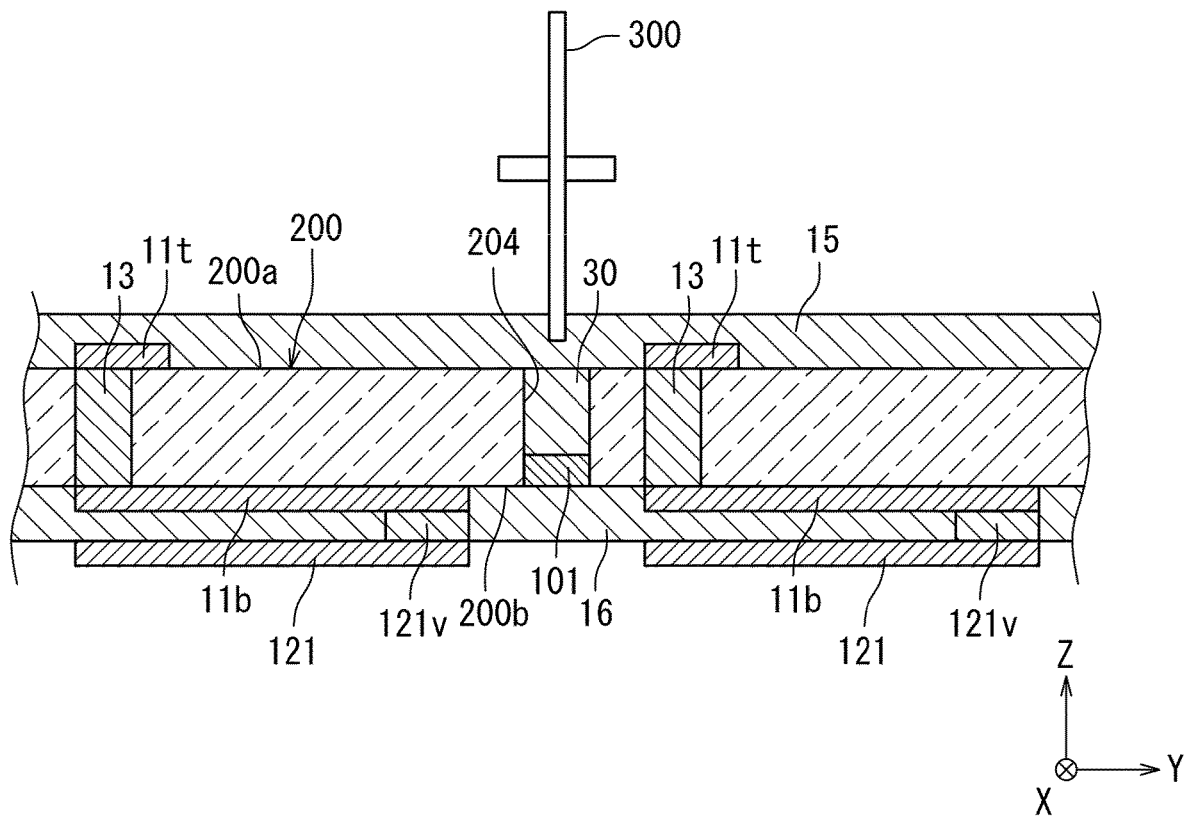
FIG. 5J is a cross-sectional view explaining the manufacturing method of the inductor component.
Figure 5K:
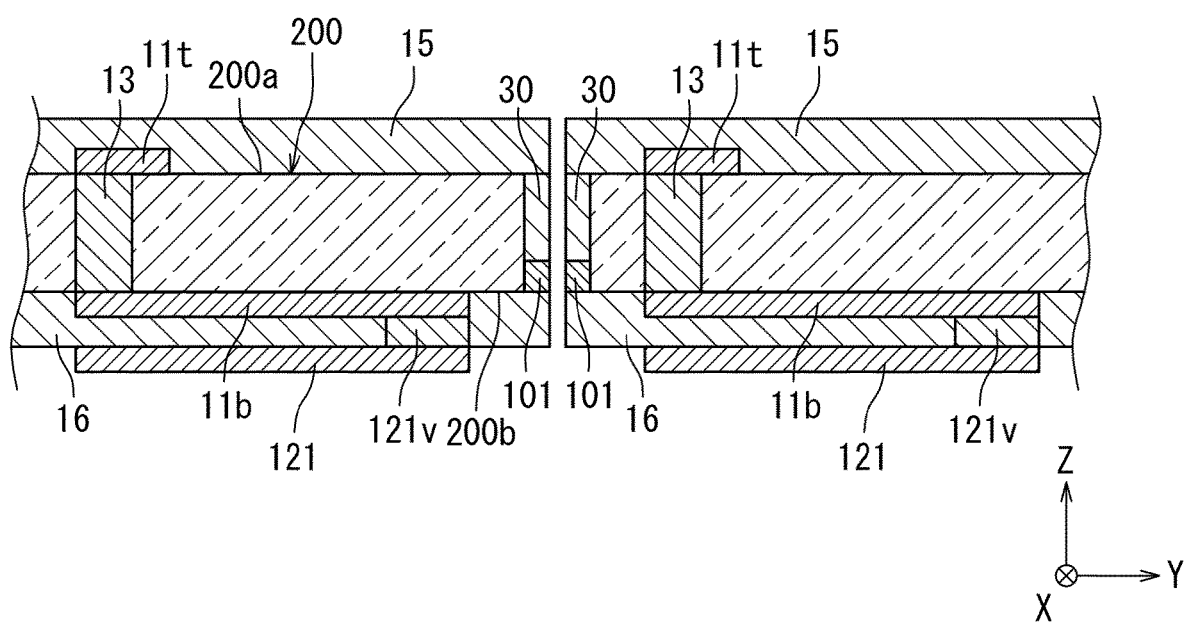
FIG. 5K is a cross-sectional view explaining the manufacturing method of the inductor component.

As shown in FIG. 5I, via holes are formed in the second protection layer 16. The first via conductor 121v is formed in each via hole. The first terminal electrodes 121 connecting to the first via conductors 121v are formed above the second protection layer 16. The first via conductors 121v and the first terminal electrodes 121 may be formed simultaneously or may be formed separately. The first via conductors 121v and the first terminal electrodes 121 are formed by, for example, a semi-additive process. FIG. 5I corresponds to a cross-sectional view taken along line B-B in FIG. 5C. FIGS. 5J and 5K similarly correspond to the cross-sectional view taken along line B-B in FIG. 5C.

As shown in FIG. 5J, the colored insulation layer 30 and the crystallized portion 101 are cut along the cutting region 203. Thus, as shown in FIG. 5K, the motherboard 200 is split into a plurality of inductor components 1 shown in FIG. 1. In detail, a dicing blade 300 is moved along the groove 204 while being moved from the first protection layer 15 toward the second protection layer 16. Alternatively, a laser may be used for the cutting process in place of the dicing blade 300.

Accordingly, the motherboard 200 is split by cutting the colored insulation layer 30 and the crystallized portion 101 along the cutting region 203, thereby facilitating the cutting process, as compared with a process involving cutting photosensitive glass. Furthermore, because the crystallized portion 101 is in contact with the colored insulation layer 30, the crystallized portion 101 is fixed to the colored insulation layer 30, thereby reducing the possibility of chipping and cracking of the crystallized portion 101 during the cutting process of the colored insulation layer 30 and the crystallized portion 101.

Furthermore, since the colored insulation layer 30 is provided in the state of the motherboard 200, a simple and low-cost process can be achieved, as compared with a case where the colored insulation layer 30 is applied to each component after the splitting process of the motherboard 200. In contrast, if the colored insulation layer 30 is to be applied to each component after the splitting process, the time and effort and the cost required for the work increase.

Second Embodiment

Figure 6:
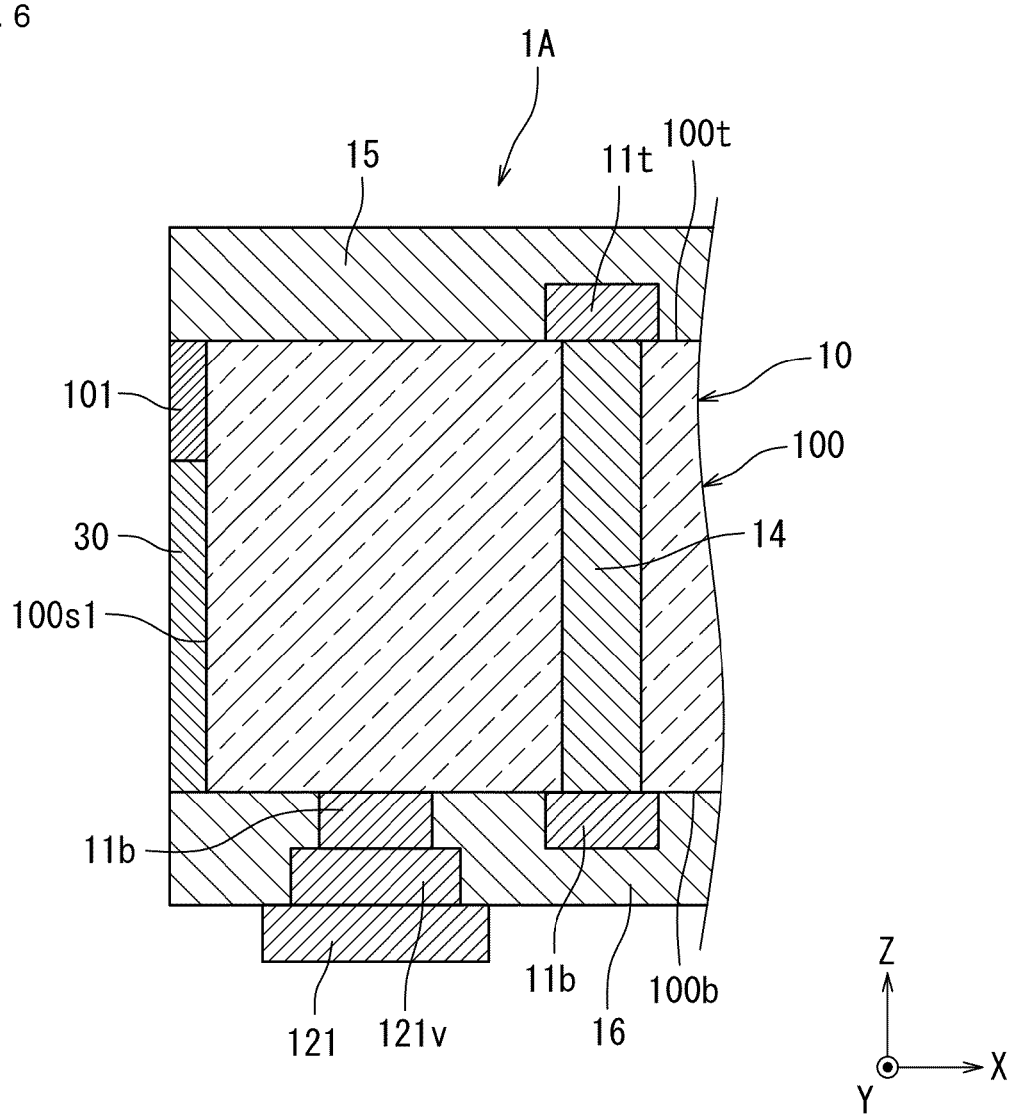
FIG. 6 is an enlarged cross-sectional view illustrating an inductor component as an electronic component according to a second embodiment.

FIG. 6 is an enlarged cross-sectional view illustrating an inductor component as an electronic component according to a second embodiment. The second embodiment is different from the first embodiment in terms of the position of the crystallized portion. This difference will be described below. Other configurations are identical to those in the first embodiment, and descriptions thereof will be omitted.

As shown in FIG. 6, in an inductor component 1A according to the second embodiment, the first side surface 100s1 has the crystallized portion 101 disposed toward the top surface 100t relative to the colored insulation layer 30.

According to the above configuration, the crystallized portion 101 can be disposed away from the terminal electrodes 121 and 122 disposed toward the bottom surface 100*b*, so that the possibility of an occurrence of stray capacitance can be reduced near the terminal electrodes 121 and 122.

When the top surface 100*t* of the glass body 100 is to be retained by using a mounter and the terminal electrodes 121 and 122 of the inductor component 1A are to be mounted to a mount substrate such that the bottom surface 100*b* of the glass body 100 faces the mount substrate, an object may tend to come into contact with the inductor component 1A at the bottom surface 100*b* of the glass body 100. However, because the crystallized portion 101 is disposed toward the top surface 100*t*, contact of the object with the crystallized portion 101 can be reduced, thereby reducing the possibility of chipping and cracking of the crystallized portion 101.

The second side surface 100*s*2, the third side surface 100*s*3, and the fourth side surface 100*s*4 have configurations and advantages similar to those of the first side surface 100*s*1. The above configuration may be satisfied with respect to at least one of the first to fourth side surfaces 100*s*1 to 100*s*4.

Third Embodiment

Figure 7:
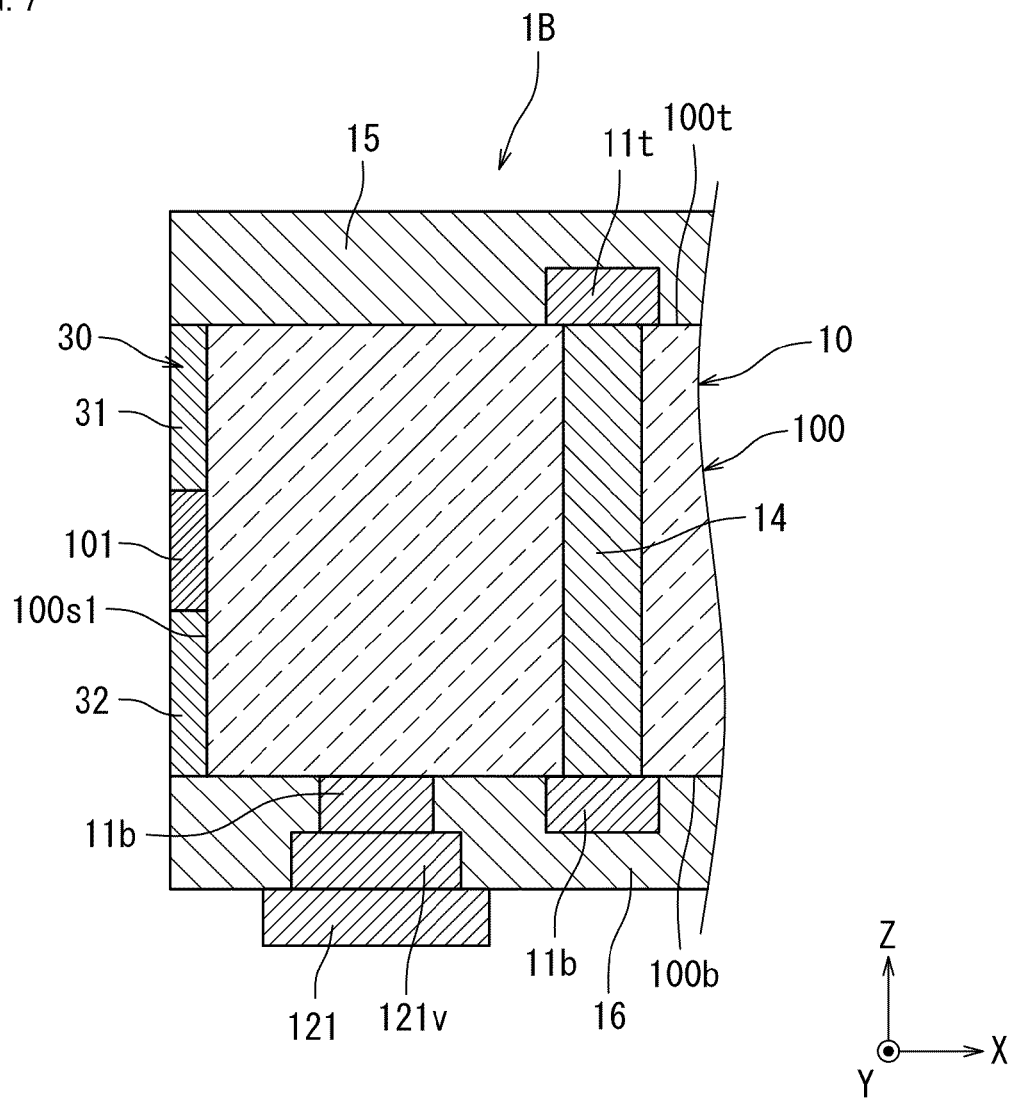
FIG. 7 is an enlarged cross-sectional view illustrating an inductor component as an electronic component according to a third embodiment.

FIG. 7 is an enlarged cross-sectional view illustrating an inductor component as an electronic component according to a third embodiment. The third embodiment is different from the first embodiment in terms of the position of the crystallized portion. This difference will be described below. Other configurations are identical to those in the first embodiment, and descriptions thereof will be omitted.

As shown in FIG. 7, in an inductor component 1B according to the third embodiment, the colored insulation layer 30 on the first side surface 100*s*1 includes a first region 31 disposed toward the top surface 100*t* relative to the crystallized portion 101 and a second region 32 disposed toward the bottom surface 100*b* relative to the crystallized portion 101. The height h2 of the colored insulation layer 30 in the Z direction shown in FIG. 3 refers to a sum of the height of the first region 31 in the Z direction and the height of the second region 32 in the Z direction.

According to the above configuration, the crystallized portion 101 can be disposed away from the top surface 100*t* and the bottom surface 100*b*, so that the crystallized portion 101 can be disposed away from the corners of the glass substrate 10 where stress tends to concentrate, thereby reducing the possibility of chipping and cracking of the crystallized portion 101.

Furthermore, because the crystallized portion 101 can be disposed away from the top surface 100*t*, the possibility of an occurrence of stray capacitance can be reduced near the top-surface conductors 11*t* disposed above the top surface 100*t*.

Moreover, after the terminal electrodes 121 and 122 of the inductor component 1B are mounted to a mount substrate such that the bottom surface 100*b* of the glass body 100 faces the mount substrate, an object may tend to come into contact with the inductor component 1B at the top surface 100*t* of the glass body 100. However, because the crystallized portion 101 can be disposed away from the top surface 100*t*, contact of the object with the crystallized portion 101 can be reduced, thereby reducing the possibility of chipping and cracking of the crystallized portion 101.

Furthermore, because the crystallized portion 101 can be disposed away from the terminal electrodes 121 and 122, the possibility of an occurrence of stray capacitance can be reduced near the terminal electrodes 121 and 122.

When the top surface 100*t* of the glass body 100 is to be retained by using a mounter and the terminal electrodes 121 and 122 of the inductor component 1B are to be mounted to a mount substrate such that the bottom surface 100*b* of the glass body 100 faces the mount substrate, an object may tend to come into contact with the inductor component 1B at the bottom surface 100*b* of the glass body 100. However, because the crystallized portion 101 can be disposed away from the bottom surface 100*b*, contact of the object with the crystallized portion 101 can be reduced, thereby reducing the possibility of chipping and cracking of the crystallized portion 101.

The second side surface 100*s*2, the third side surface 100*s*3, and the fourth side surface 100*s*4 have configurations and advantages similar to those of the first side surface 100*s*1. The above configuration may be satisfied with respect to at least one of the first to fourth side surfaces 100*s*1 to 100*s*4.

A manufacturing method of the inductor component 1B will now be described.

Figure 8A:
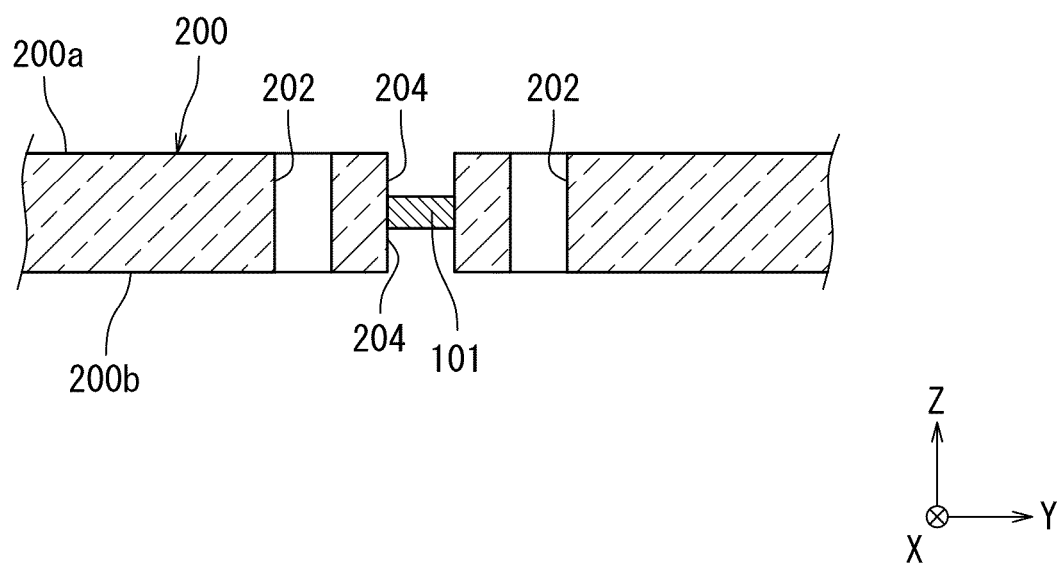
FIG. 8A is a cross-sectional view explaining a manufacturing method of the inductor component.

First, a manufacturing process is performed using a method identical to the manufacturing method according to the first embodiment shown in FIGS. 5A and 5B. Then, as shown in FIG. 8A, etching is performed from the first principal surface 200*a* and the second principal surface 200*b* of the motherboard 200 without providing the protection film 205 shown in FIG. 5D. Accordingly, the remaining non-removed crystallized portion 101 can be located in a central area, in the Z direction, between the first principal surface 200*a* and the second principal surface 200*b*. In other words, the groove 204 can be provided at opposite sides of the crystallized portion 101 in the Z direction.

Figure 8B:
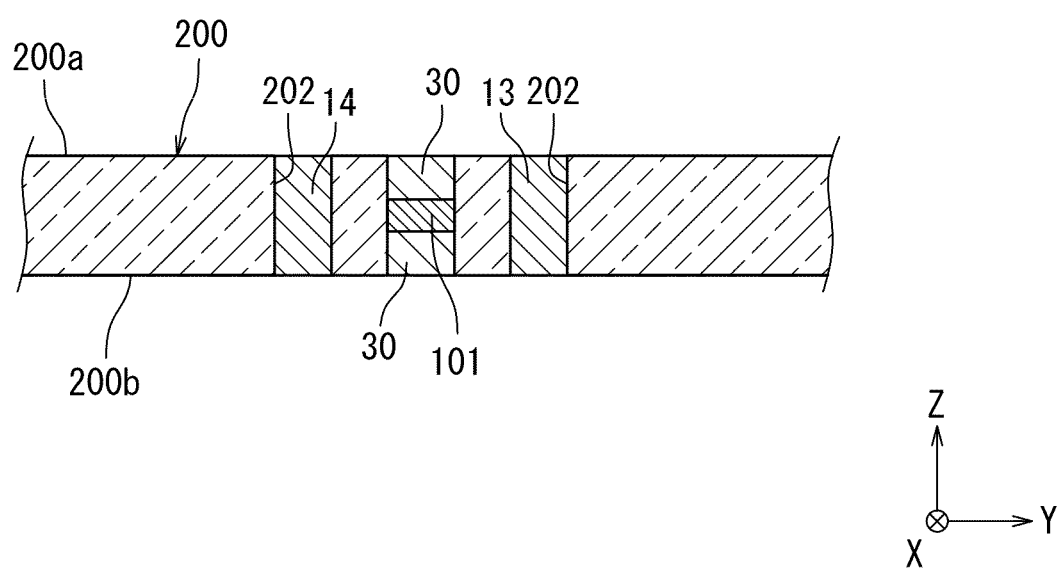
FIG. 8B is a cross-sectional view explaining the manufacturing method of the inductor component.

Subsequently, as shown in FIG. 8B, the first through-conductors 13 and the second through-conductors 14 are formed in the through-holes 202 in the motherboard 200, the colored insulation layer 30 is embedded within the groove 204, and the colored insulation layer 30 is brought into contact with the crystallized portion 101. Then, the inductor component 1B is manufactured by using a method identical to the manufacturing method shown in FIGS. 5G to 5K.

Fourth Embodiment

Figure 9:
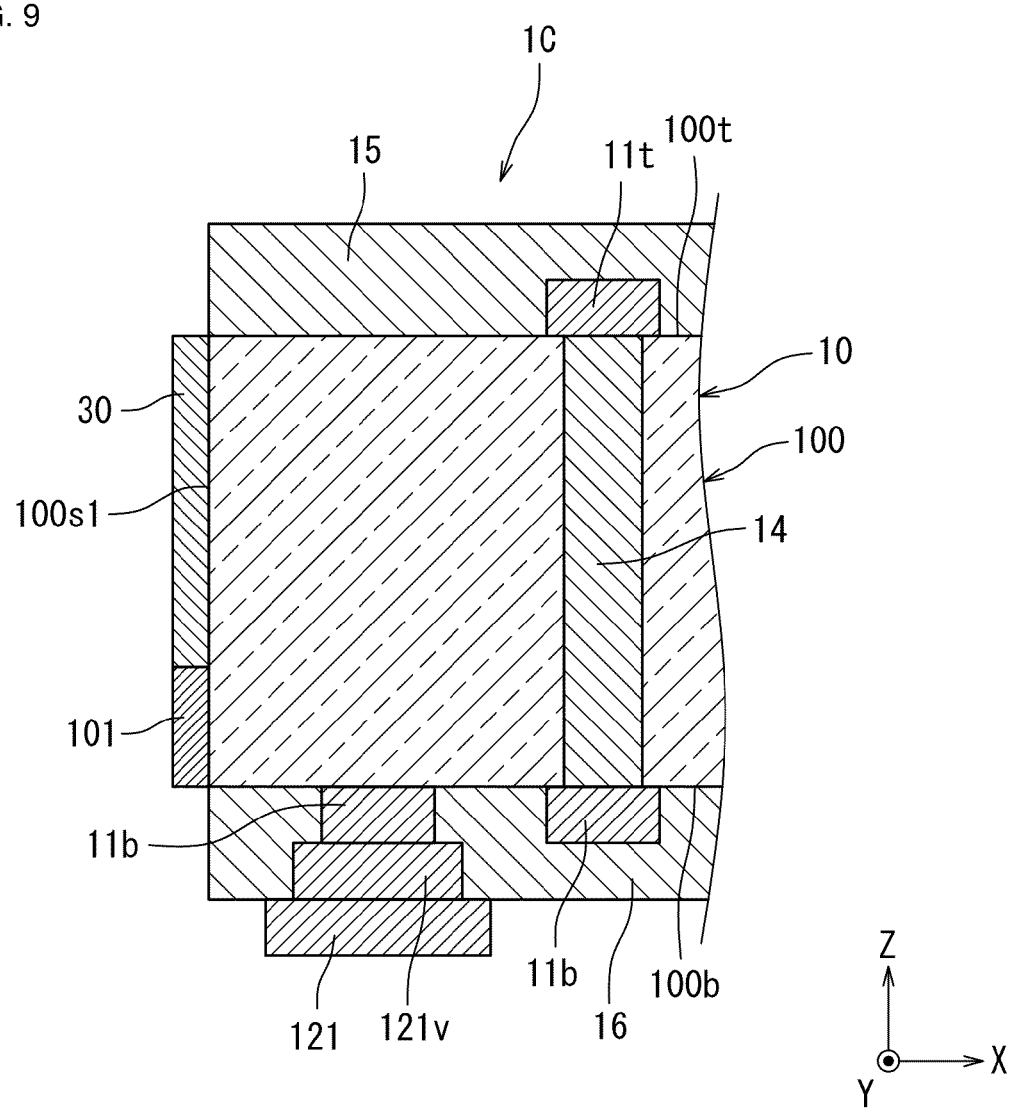
FIG. 9 is an enlarged cross-sectional view illustrating an inductor component as an electronic component according to a fourth embodiment.

FIG. 9 is an enlarged cross-sectional view illustrating an inductor component as an electronic component according to a fourth embodiment. The fourth embodiment is different from the first embodiment in terms of the sizes of the first protection layer and the second protection layer. This difference will be described below. Other configurations are identical to those in the first embodiment, and descriptions thereof will be omitted.

As shown in FIG. 9, in an inductor component 1C according to the fourth embodiment, at the first side surface 100*s*1, the first protection layer 15 does not overlap the colored insulation layer 30, as viewed from the Z direction, and the second protection layer 16 does not overlap the crystallized portion 101, as viewed from the Z direction. In detail, as viewed from above in the Z direction, the first protection layer 15 is disposed away from the colored insulation layer 30. A step is provided between a side surface of the first protection layer 15 located in the direction orthogonal to the Z direction and a side surface of the colored insulation layer 30 located in the direction orthogonal to the Z direction. As viewed from below in the Z direction, the second protection layer 16 is disposed away from the crystallized portion 101. A step is provided between a side surface of the second protection layer 16 located in the direction orthogonal to the Z direction and a side surface of the crystallized portion 101 located in the direction orthogonal to the Z direction.

According to the above configuration, when the colored insulation layer 30 and the crystallized portion 101 are to be cut along the cutting region 203 (groove 204), as shown in FIG. 5J, during a manufacturing process of the inductor component 1C, since the first protection layer 15 and the second protection layer 16 do not overlap the colored insulation layer 30 and the crystallized portion 101, as viewed from the Z direction, the dicing blade 300 does not come into contact with the first protection layer 15 and the second protection layer 16. Therefore, during the cutting process by the dicing blade 300, delamination of the first protection layer 15 and the second protection layer 16 from the glass substrate 10 (motherboard 200) can be suppressed.

Furthermore, the second side surface 100s2, the third side surface 100s3, and the fourth side surface 100s4 have configurations and advantages similar to those of the first side surface 100s1. As viewed from the Z direction, one of the first protection layer 15 and the second protection layer 16 may be disposed to overlap the colored insulation layer 30 and the crystallized portion 101. Moreover, the above configuration may be satisfied with respect to at least one of the first to fourth side surfaces 100s1 to 100s4.

Fifth Embodiment

Figure 10:
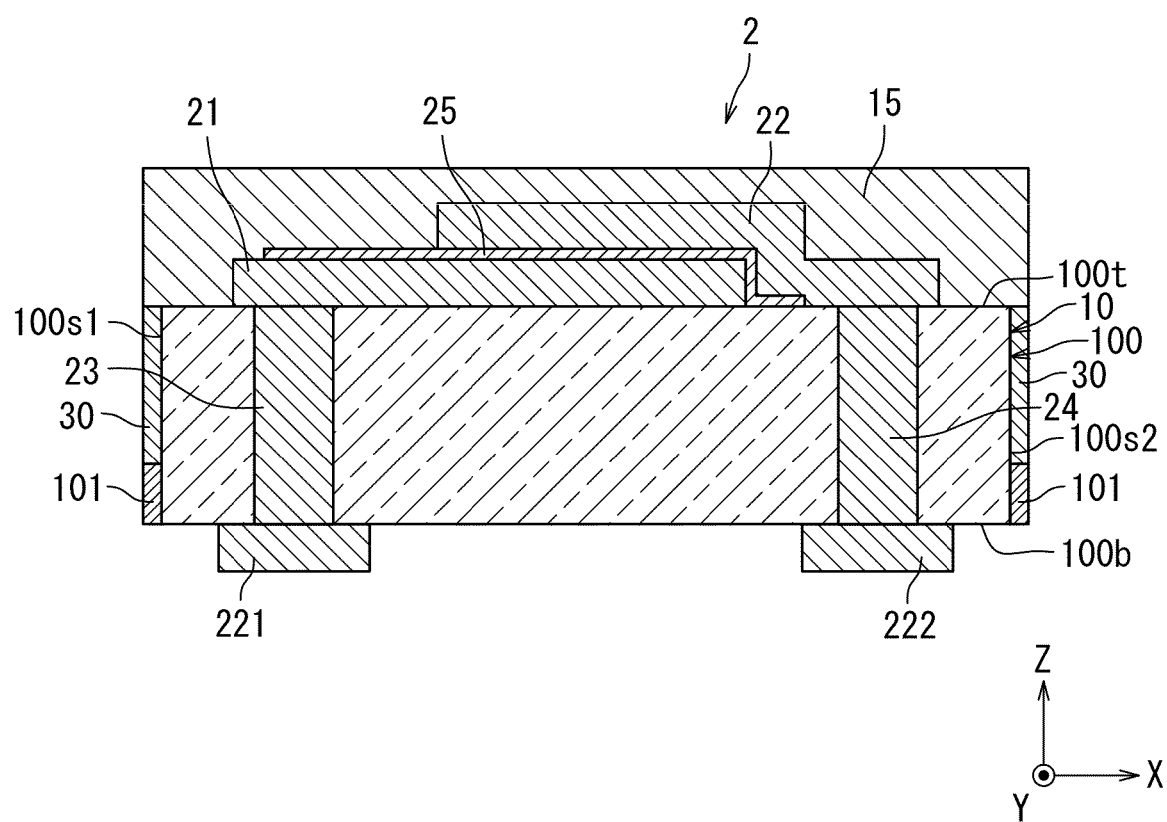
FIG. 10 is a cross-sectional view illustrating a capacitor component as an electronic component according to a fifth embodiment.

In a fifth embodiment, the electronic component according to the present disclosure is described as being a capacitor component as an example. FIG. 10 is a cross-sectional view of the capacitor component. A capacitor component 2 is, for example, a surface-mounted capacitor component used in a high-frequency-signal transmission circuit.

As shown in FIG. 10, the capacitor component 2 includes a glass substrate 10, a first plate electrode 21 and a second plate electrode 22 that are provided on the glass substrate 10, a first protection layer 15 provided on the glass substrate 10 and covering the first plate electrode 21 and the second plate electrode 22, a colored insulation layer 30 provided on the side surfaces of the glass substrate 10, and a first terminal electrode 221 and a second terminal electrode 222 that are provided on the glass substrate 10. The first plate electrode 21 and the second plate electrode 22 each correspond to an example of an "outer-surface conductor" defined in the claims.

The material of the glass substrate 10 is the same as the material of the glass substrate 10 according to the first embodiment. In other words, the glass substrate 10 has the glass body 100 and the crystallized portion 101. The material of the first protection layer 15 is the same as the material of the first protection layer 15 according to the first embodiment. The material of the colored insulation layer 30 is the same as the material of the colored insulation layer 30 according to the first embodiment. The material of the first plate electrode 21 and the second plate electrode 22 is the same as the material of the top-surface conductors 11t and the bottom-surface conductors 11b according to the first embodiment. The material of the first terminal electrode 221 and the second terminal electrode 222 is the same as the material of the first terminal electrode 121 and the second terminal electrode 122 according to the first embodiment.

The first plate electrode 21 and the second plate electrode 22 are provided on the top surface 100t of the glass substrate 10. The first plate electrode 21 is in contact with the top surface 100t of the glass substrate 10, and the second plate electrode 22 is located above the first plate electrode 21. The first plate electrode 21 and the second plate electrode 22 have a dielectric film 25 provided therebetween. The first plate electrode 21, the second plate electrode 22, and the dielectric film 25 constitute a capacitor element.

The first terminal electrode 221 and the second terminal electrode 222 are in contact with the bottom surface 100b of the glass substrate 10. The first terminal electrode 221 and the second terminal electrode 222 are disposed away from each other.

The capacitor component 2 further has a first through-conductor 23 and a second through-conductor 24 that extend through the glass substrate 10. The first through-conductor 23 is connected between the first terminal electrode 221 and the first plate electrode 21. The second through-conductor 24 is connected between the second terminal electrode 222 and the second plate electrode 22.

Similar to the first embodiment, the first side surface 100s1 to the fourth side surface 100s4 of the glass body 100 are provided with the crystallized portion 101 and the colored insulation layer 30. Alternatively, at least one of the first side surface 100s1 to the fourth side surface 100s4 may be provided with the crystallized portion 101 and the colored insulation layer 30.

According to the above configuration, the first side surface 100s1 of the glass body 100 is provided with the crystallized portion 101 and the colored insulation layer 30, so that when the capacitor component 2 is to be detected from the first side surface 100s1 of the glass body 100 by using a detector, such as a laser sensor or a camera, the crystallized portion 101 and the colored insulation layer 30 with low transparency can be readily recognized, whereby the capacitor component 2 can be readily detected.

Furthermore, as viewed from the direction orthogonal to the first side surface 100s1, the crystallized portion 101 and the colored insulation layer 30 extend in the Y direction. Thus, when the capacitor component 2 is to be detected by scanning the detector in the Y direction, the crystallized portion 101 or the colored insulation layer 30 can be readily recognized, whereby the capacitor component 2 can be readily detected.

Moreover, since the first side surface 100s1 of the glass body 100 is provided with the crystallized portion 101 and the colored insulation layer 30, the exposed area of the glass body 100 can be reduced, and the mechanical strength of the capacitor component 2 against an external force can be increased. The mechanical strength of crystallized glass is higher than the mechanical strength of non-crystallized glass.

The second side surface 100s2, the third side surface 100s3, and the fourth side surface 100s4 have configurations and advantages similar to those of the first side surface 100s1. The above configuration may be satisfied with respect to at least one of the first to fourth side surfaces 100s1 to 100s4.

The present disclosure is not limited to the above embodiments, and design modifications are permissible so long as they do not depart from the scope of the present disclosure. For example, the features of the first to fifth embodiments may be variously combined. Although an inductor component is used as the electronic component in each of the first to fourth embodiments, and a capacitor component is used as the electronic component in the fifth embodiment, another electronic component, such as a resistor component, may be used, or a composite component having a combination of these components may be used.

As an alternative to the first to fourth embodiments in which the top surface and the bottom surface of the glass body are provided with the respective outer-surface conductors (i.e., the bottom-surface conductors and the top-surface conductors) and the top surface and the bottom surface are provided with the respective protection layers (i.e., the first protection layer and the second protection layer) to cover the outer-surface conductors, at least one of the top surface and the bottom surface of the glass body may be provided with an outer-surface conductor, and at least one of the surfaces may be provided with a protection layer to cover the outer-surface conductor. As another alternative, each of the top surface and the bottom surface does not have to be provided with a protection layer.

The present disclosure includes the following aspects.

1. An electronic component comprising: a glass substrate having a glass body and a protruding crystallized portion, the glass body including a top surface, a bottom surface, and a first side surface connecting the bottom surface and the top surface to each other, the first side surface of the glass body being provided with the crystallized portion; a colored insulation layer provided on the first side surface of the glass body; and a through-conductor provided within the glass body and extending through the top surface and the bottom surface. The crystallized portion extends in a first direction that is parallel to the bottom surface, as viewed from a direction orthogonal to the first side surface, and as viewed from the direction orthogonal to the first side surface, at least a portion of the colored insulation layer extends in the first direction and is disposed adjacent to the crystallized portion in a second direction that is orthogonal to the first direction.

2. The electronic component according to aspect 1, wherein an area where the first side surface does not have the crystallized portion is entirely provided with the colored insulation layer.

3. The electronic component according to aspect 1 or 2, wherein a thickness of the crystallized portion in the direction orthogonal to the first side surface and a thickness of the colored insulation layer in the direction orthogonal to the first side surface are equal to each other.

4. The electronic component according to any one of aspects 1 to 3, wherein a height of the crystallized portion in the second direction is smaller than a height of the colored insulation layer in the second direction.

5. The electronic component according to any one of aspects 1 to 4, wherein a relationship between a height h1 of the crystallized portion in the second direction and a height H of the first side surface in the second direction satisfies $1/5 < h1/H < 1/2$.

6. The electronic component according to any one of aspects 1 to 5, further comprising a terminal electrode disposed above the bottom surface and electrically connected to the through-conductor, wherein the crystallized portion is disposed toward the bottom surface relative to the colored insulation layer.

7. The electronic component according to any one of aspects 1 to 5, further comprising a terminal electrode disposed above the bottom surface and electrically connected to the through-conductor, wherein the crystallized portion is disposed toward the top surface relative to the colored insulation layer.

8. The electronic component according to any one of aspects 1 to 5, further comprising a terminal electrode disposed above the bottom surface and electrically connected to the through-conductor, wherein the colored insulation layer includes a first region disposed toward the top surface relative to the crystallized portion and a second region disposed toward the bottom surface relative to the crystallized portion.

9. The electronic component according to any one of aspects 1 to 8, further comprising an outer-surface conductor that is disposed above at least one of the top surface and the bottom surface and that is electrically connected to the through-conductor; and a protection layer provided above the at least one of the top surface and the bottom surface to cover the outer-surface conductor.

10. A manufacturing method of an electronic component, comprising a step for preparing a motherboard composed of photosensitive glass and including a first principal surface and a second principal surface; a step for irradiating a cutting region of the first principal surface with ultraviolet light and subsequently crystallizing the motherboard by heating to form a crystallized portion extending from the first principal surface to the second principal surface in a direction parallel to the first principal surface; a step for causing a part of the crystallized portion to remain in the cutting region while removing another part of the crystallized portion by etching to form a groove extending in a direction parallel to the first principal surface; and a step for forming a through-conductor extending through the first principal surface and the second principal surface of the motherboard. The manufacturing method further includes a step for embedding a colored insulation layer within the groove and bringing the colored insulation layer into contact with the crystallized portion; and a step for splitting the motherboard into a plurality of electronic components by cutting the colored insulation layer and the crystallized portion along the cutting region.

11. The manufacturing method of the electronic component according to aspect 10, further comprising a step for forming an outer-surface conductor electrically connected to the through-conductor above at least one of the first principal surface and the second principal surface; and a step for forming a protection layer above the at least one of the first principal surface and the second principal surface to cover the outer-surface conductor. The step for forming the outer-surface conductor and the step for forming the protection layer are performed prior to the step for splitting the motherboard into the plurality of electronic components.

What is claimed is:
1. An electronic component comprising:
a glass substrate having a glass body and a protruding crystallized portion, the glass body including a top surface, a bottom surface, and a first side surface connecting the bottom surface and the top surface to each other, the first side surface of the glass body having the crystallized portion;
a colored insulation layer on the first side surface of the glass body; and
a through-conductor within the glass body and extending through the top surface and the bottom surface,
wherein
the crystallized portion extends in a first direction that is parallel to the bottom surface, as viewed from a direction orthogonal to the first side surface, and
as viewed from the direction orthogonal to the first side surface, at least a portion of the colored insulation layer extends in the first direction and is adjacent to the crystallized portion in a second direction that is orthogonal to the first direction.
2. The electronic component according to claim 1, wherein
an area of the first side surface where the crystallized portion is absent entirely includes the colored insulation layer.

3. The electronic component according to claim 1, wherein
a thickness of the crystallized portion in the direction orthogonal to the first side surface and a thickness of the colored insulation layer in the direction orthogonal to the first side surface are equal to each other.

4. The electronic component according to claim 1, wherein
a height of the crystallized portion in the second direction is smaller than a height of the colored insulation layer in the second direction.

5. The electronic component according to claim 1, wherein
a relationship between a height h1 of the crystallized portion in the second direction and a height H of the first side surface in the second direction satisfies $1/5 < h1/H < 1/2$.

6. The electronic component according to claim 1, further comprising:
a terminal electrode above the bottom surface and electrically connected to the through-conductor,
wherein the crystallized portion is disposed toward the bottom surface relative to the colored insulation layer.

7. The electronic component according to claim 1, further comprising:
a terminal electrode above the bottom surface and electrically connected to the through-conductor,
wherein the crystallized portion is disposed toward the top surface relative to the colored insulation layer.

8. The electronic component according to claim 1, further comprising:
a terminal electrode above the bottom surface and electrically connected to the through-conductor,
wherein the colored insulation layer includes a first region disposed toward the top surface relative to the crystallized portion and a second region disposed toward the bottom surface relative to the crystallized portion.

9. The electronic component according to claim 1, further comprising:
an outer-surface conductor that is above at least one of the top surface and the bottom surface and that is electrically connected to the through-conductor; and
a protection layer above the at least one of the top surface and the bottom surface to cover the outer-surface conductor.

10. The electronic component according to claim 2, wherein
a thickness of the crystallized portion in the direction orthogonal to the first side surface and a thickness of the colored insulation layer in the direction orthogonal to the first side surface are equal to each other.

11. The electronic component according to claim 2, wherein
a height of the crystallized portion in the second direction is smaller than a height of the colored insulation layer in the second direction.

12. The electronic component according to claim 3, wherein
a height of the crystallized portion in the second direction is smaller than a height of the colored insulation layer in the second direction.

13. The electronic component according to claim 2, wherein
a relationship between a height h1 of the crystallized portion in the second direction and a height H of the first side surface in the second direction satisfies $1/5 < h1/H < 1/2$.

14. The electronic component according to claim 3, wherein
a relationship between a height h1 of the crystallized portion in the second direction and a height H of the first side surface in the second direction satisfies $1/5 < h1/H < 1/2$.

15. The electronic component according to claim 2, further comprising:
a terminal electrode above the bottom surface and electrically connected to the through-conductor,
wherein the crystallized portion is disposed toward the bottom surface relative to the colored insulation layer.

16. The electronic component according to claim 2, further comprising:
a terminal electrode above the bottom surface and electrically connected to the through-conductor,
wherein the crystallized portion is disposed toward the top surface relative to the colored insulation layer.

17. The electronic component according to claim 2, further comprising:
a terminal electrode above the bottom surface and electrically connected to the through-conductor,
wherein the colored insulation layer includes a first region disposed toward the top surface relative to the crystallized portion and a second region disposed toward the bottom surface relative to the crystallized portion.

18. The electronic component according to claim 2, further comprising:
an outer-surface conductor that is above at least one of the top surface and the bottom surface and that is electrically connected to the through-conductor; and
a protection layer above the at least one of the top surface and the bottom surface to cover the outer-surface conductor.

19. A manufacturing method of an electronic component, comprising:
preparing a motherboard composed of photosensitive glass and including a first principal surface and a second principal surface;
irradiating a cutting region of the first principal surface with ultraviolet light and subsequently crystallizing the motherboard by heating to form a crystallized portion extending from the first principal surface to the second principal surface in a direction parallel to the first principal surface;
causing a part of the crystallized portion to remain in the cutting region while removing another part of the crystallized portion by etching to form a groove extending in a direction parallel to the first principal surface;
forming a through-conductor extending through the first principal surface and the second principal surface of the motherboard;
embedding a colored insulation layer within the groove and bringing the colored insulation layer into contact with the crystallized portion; and
splitting the motherboard into a plurality of electronic components by cutting the colored insulation layer and the crystallized portion along the cutting region.

20. The manufacturing method of the electronic component according to claim 19, further comprising:
forming an outer-surface conductor electrically connected to the through-conductor above at least one of the first principal surface and the second principal surface; and
forming a protection layer above the at least one of the first principal surface and the second principal surface to cover the outer-surface conductor, wherein the forming of the outer-surface conductor and the forming of the protection layer are performed prior to the splitting of the motherboard into the plurality of electronic components.

\* \* \* \* \*